United States Patent
Redgrave et al.

(10) Patent No.: US 8,112,468 B1
(45) Date of Patent: Feb. 7, 2012

(54) METHOD AND APPARATUS FOR PERFORMING AN OPERATION WITH A PLURALITY OF SUB-OPERATIONS IN A CONFIGURABLE IC

(75) Inventors: Jason Redgrave, Mountain View, CA (US); Andrew Caldwell, Santa Clara, CA (US); Steven Teig, Menlo Park, CA (US)

(73) Assignee: Tabula, Inc., Santa Clara, CA (US)

( * ) Notice: Subject to any disclaimer, the term of this patent is extended or adjusted under 35 U.S.C. 154(b) by 1099 days.

(21) Appl. No.: 11/754,262

(22) Filed: May 25, 2007

Related U.S. Application Data

(60) Provisional application No. 61/066,135, filed on Mar. 22, 2007.

(51) Int. Cl.
*G06F 7/52* (2006.01)
(52) U.S. Cl. .......................... 708/625; 708/628
(58) Field of Classification Search .............. 708/625, 708/627, 632
See application file for complete search history.

(56) References Cited

U.S. PATENT DOCUMENTS

| | | | |
|---|---|---|---|
| 4,546,446 A * | 10/1985 | Machida | 708/627 |
| 4,873,459 A | 10/1989 | El Gamal et al. | |
| 5,150,326 A | 9/1992 | Aoki | |
| 5,245,575 A | 9/1993 | Sasaki et al. | |
| 5,270,581 A | 12/1993 | Nakamura | |
| 5,325,329 A | 6/1994 | Inoue et al. | |
| 5,329,498 A | 7/1994 | Greenstein | |
| 5,349,250 A | 9/1994 | New | |
| 5,357,153 A | 10/1994 | Chiang et al. | |
| 5,365,125 A | 11/1994 | Goetting et al. | |
| 5,369,622 A | 11/1994 | McLaury | |
| 5,371,708 A | 12/1994 | Kobayashi | |
| 5,426,378 A | 6/1995 | Ong | |
| 5,521,835 A | 5/1996 | Trimberger | |
| 5,532,958 A | 7/1996 | Jiang et al. | |
| 5,544,078 A | 8/1996 | Podkowa | |

(Continued)

FOREIGN PATENT DOCUMENTS

EP 2201569 6/2010

(Continued)

OTHER PUBLICATIONS

U.S. Appl. No. 12/200,867, filed Aug. 28, 2008, Schmit, Herman, et al.

(Continued)

*Primary Examiner* — Chuong D Ngo
(74) *Attorney, Agent, or Firm* — Adeli & Tollen LLP

(57) ABSTRACT

Some embodiments provide a method of performing a mathematical operation on a set of operands. The mathematical operation includes several sub-operations. The method examines several bits of at least one operand at a time and depending on the value of these bits, reconfigures a single logic circuit to perform one of the sub-operations to generate a partial result of the mathematical operation. In some embodiments, the logic circuit is reconfigured by receiving a first set of configuration data that cause the logic circuit to reconfigure to perform a first sub-operation operation and a second set of configuration data that cause the logic circuit to reconfigure to perform a second sub-operation. In some embodiments, the logic circuit receives different inputs based on the value of the bits being examined. In some embodiments, the mathematical operation is multiplication and the sub-operations are addition and subtraction.

7 Claims, 26 Drawing Sheets

U.S. PATENT DOCUMENTS

| | | |
|---|---|---|
| 5,552,721 A | 9/1996 | Gould |
| 5,581,500 A | 12/1996 | D'Souza |
| 5,596,743 A | 1/1997 | Bhat et al. |
| 5,600,263 A | 2/1997 | Trimberger et al. |
| 5,610,829 A | 3/1997 | Trimberger |
| 5,629,637 A | 5/1997 | Trimberger et al. |
| 5,631,578 A | 5/1997 | Clinton et al. |
| 5,640,106 A | 6/1997 | Erickson et al. |
| 5,646,544 A | 7/1997 | Iadanza |
| 5,646,545 A | 7/1997 | Trimberger et al. |
| 5,659,484 A | 8/1997 | Bennett et al. |
| 5,682,107 A | 10/1997 | Tavana et al. |
| 5,692,147 A | 11/1997 | Larsen et al. |
| 5,694,057 A | 12/1997 | Gould |
| 5,701,441 A | 12/1997 | Trimberger |
| 5,719,889 A | 2/1998 | Iadanza |
| 5,721,498 A | 2/1998 | Mason et al. |
| 5,732,246 A | 3/1998 | Gould et al. |
| 5,734,622 A | 3/1998 | Furumochi et al. |
| 5,737,235 A | 4/1998 | Kean et al. |
| 5,745,422 A | 4/1998 | Iadanza |
| 5,745,734 A | 4/1998 | Craft et al. |
| 5,760,602 A | 6/1998 | Tan |
| 5,761,483 A | 6/1998 | Trimberger |
| 5,764,954 A | 6/1998 | Fuller et al. |
| 5,768,178 A | 6/1998 | McLaury |
| 5,777,360 A | 7/1998 | Rostoker et al. |
| 5,802,003 A | 9/1998 | Iadanza et al. |
| 5,815,726 A | 9/1998 | Cliff |
| 5,825,662 A | 10/1998 | Trimberger |
| 5,847,577 A | 12/1998 | Trimberger |
| 5,889,411 A | 3/1999 | Chaudhary |
| 5,914,616 A | 6/1999 | Young et al. |
| 5,914,906 A | 6/1999 | Iadanza et al. |
| 5,940,603 A | 8/1999 | Huang |
| 5,944,813 A | 8/1999 | Trimberger |
| 5,958,000 A * | 9/1999 | Jiang ............................ 708/627 |
| 5,970,240 A | 10/1999 | Chen et al. |
| 5,982,655 A | 11/1999 | Doyle |
| 5,991,191 A | 11/1999 | Rao |
| 6,002,991 A | 12/1999 | Conn, Jr. |
| 6,023,421 A | 2/2000 | Clinton et al. |
| 6,038,192 A | 3/2000 | Clinton et al. |
| 6,044,031 A | 3/2000 | Iadanza et al. |
| 6,054,873 A | 4/2000 | Laramie |
| 6,057,707 A | 5/2000 | Schleicher et al. |
| 6,069,490 A | 5/2000 | Ochotta et al. |
| 6,075,745 A | 6/2000 | Gould et al. |
| 6,084,429 A | 7/2000 | Trimberger |
| 6,086,631 A | 7/2000 | Chaudhary et al. |
| 6,091,263 A | 7/2000 | New et al. |
| 6,091,645 A | 7/2000 | Iadanza |
| 6,107,821 A | 8/2000 | Kelem et al. |
| 6,110,223 A | 8/2000 | Southgate et al. |
| 6,111,779 A | 8/2000 | You |
| 6,118,707 A | 9/2000 | Gould et al. |
| 6,130,854 A | 10/2000 | Gould et al. |
| 6,134,154 A | 10/2000 | Iwaki et al. |
| 6,140,839 A | 10/2000 | Kaviani et al. |
| 6,150,838 A | 11/2000 | Wittig et al. |
| 6,163,168 A | 12/2000 | Nguyen et al. |
| 6,166,946 A | 12/2000 | Naffziger |
| 6,172,521 B1 | 1/2001 | Motomura |
| 6,173,379 B1 | 1/2001 | Poplingher et al. |
| 6,175,247 B1 | 1/2001 | Scalera et al. |
| 6,184,707 B1 | 2/2001 | Norman et al. |
| 6,184,709 B1 | 2/2001 | New |
| 6,204,687 B1 | 3/2001 | Schultz et al. |
| 6,205,076 B1 | 3/2001 | Wakayama et al. |
| 6,229,337 B1 | 5/2001 | Xiao et al. |
| 6,233,191 B1 | 5/2001 | Gould et al. |
| 6,255,849 B1 | 7/2001 | Mohan |
| 6,275,064 B1 | 8/2001 | Agrawal et al. |
| 6,292,019 B1 | 9/2001 | New et al. |
| 6,326,651 B1 | 12/2001 | Manabe |
| 6,326,807 B1 | 12/2001 | Veenstra et al. |
| 6,346,824 B1 | 2/2002 | New |
| 6,348,813 B1 | 2/2002 | Agrawal et al. |
| 6,381,732 B1 | 4/2002 | Burnham et al. |
| 6,404,224 B1 | 6/2002 | Azegami et al. |
| 6,411,128 B2 | 6/2002 | Maeda |
| 6,414,880 B1 | 7/2002 | Yabe et al. |
| 6,430,736 B1 | 8/2002 | Levi et al. |
| 6,469,540 B2 | 10/2002 | Nakaya |
| 6,469,553 B1 | 10/2002 | Sung et al. |
| 6,480,954 B2 | 11/2002 | Trimberger et al. |
| 6,487,709 B1 | 11/2002 | Keller et al. |
| 6,490,707 B1 | 12/2002 | Baxter |
| 6,496,041 B2 | 12/2002 | Hirairi |
| 6,496,918 B1 | 12/2002 | Dehon et al. |
| 6,501,698 B1 | 12/2002 | Mobley |
| 6,515,505 B1 | 2/2003 | Rees |
| 6,515,509 B1 | 2/2003 | Baxter |
| 6,526,559 B2 | 2/2003 | Schiefele et al. |
| 6,529,040 B1 | 3/2003 | Carberry et al. |
| 6,545,501 B1 | 4/2003 | Bailis et al. |
| 6,552,949 B1 | 4/2003 | Silla et al. |
| 6,560,139 B2 | 5/2003 | Ma et al. |
| 6,593,771 B2 | 7/2003 | Bailis et al. |
| 6,601,227 B1 | 7/2003 | Trimberger |
| 6,603,330 B1 | 8/2003 | Snyder |
| 6,603,345 B2 | 8/2003 | Takahashi |
| 6,629,308 B1 | 9/2003 | Baxter |
| 6,636,070 B1 | 10/2003 | Altaf |
| 6,642,744 B2 | 11/2003 | Or-Bach et al. |
| 6,643,173 B2 | 11/2003 | Takemura |
| 6,650,142 B1 | 11/2003 | Agrawal et al. |
| 6,657,911 B2 | 12/2003 | Yamaoka et al. |
| 6,667,635 B1 | 12/2003 | Pi et al. |
| 6,668,361 B2 | 12/2003 | Bailis et al. |
| 6,675,309 B1 | 1/2004 | Baxter |
| 6,686,769 B1 | 2/2004 | Nguyen et al. |
| 6,703,861 B2 | 3/2004 | Ting |
| 6,714,041 B1 | 3/2004 | Darling et al. |
| 6,717,436 B2 | 4/2004 | Kress et al. |
| 6,724,648 B2 | 4/2004 | Khellah et al. |
| 6,732,068 B2 | 5/2004 | Sample et al. |
| 6,747,478 B2 | 6/2004 | Madurawe |
| 6,768,337 B2 | 7/2004 | Kohno et al. |
| 6,791,352 B2 | 9/2004 | Verdoorn et al. |
| 6,798,688 B2 | 9/2004 | Joshi |
| 6,806,730 B2 | 10/2004 | Bailis et al. |
| 6,809,979 B1 | 10/2004 | Tang |
| 6,829,756 B1 | 12/2004 | Trimberger |
| 6,831,479 B2 | 12/2004 | Lo |
| 6,838,902 B1 | 1/2005 | Elftmann et al. |
| 6,894,527 B1 | 5/2005 | Donlin et al. |
| 6,903,962 B2 | 6/2005 | Nii |
| 6,911,842 B1 | 6/2005 | Ghia et al. |
| 6,920,627 B2 | 7/2005 | Blodget et al. |
| 6,924,663 B2 | 8/2005 | Masui et al. |
| 6,925,025 B2 | 8/2005 | Deng et al. |
| 6,937,172 B1 | 8/2005 | Lowe et al. |
| 6,937,535 B2 | 8/2005 | Ahn et al. |
| 6,956,399 B1 | 10/2005 | Bauer |
| 6,970,374 B2 | 11/2005 | Lin |
| 6,992,505 B1 | 1/2006 | Zhou |
| 6,998,872 B1 | 2/2006 | Chirania et al. |
| 7,010,667 B2 | 3/2006 | Vorbach et al. |
| 7,027,346 B2 | 4/2006 | Houston et al. |
| 7,028,281 B1 | 4/2006 | Agrawal et al. |
| 7,030,651 B2 | 4/2006 | Madurawe |
| 7,061,941 B1 | 6/2006 | Zheng |
| 7,064,577 B1 | 6/2006 | Lee |
| 7,075,333 B1 | 7/2006 | Chaudhary et al. |
| 7,088,136 B1 | 8/2006 | Lewis |
| 7,107,568 B2 | 9/2006 | Cronquist |
| 7,109,752 B1 | 9/2006 | Schmit et al. |
| 7,110,317 B2 | 9/2006 | Song et al. |
| 7,112,992 B1 | 9/2006 | Guzman et al. |
| 7,113,421 B2 | 9/2006 | Maeda et al. |
| 7,116,131 B1 | 10/2006 | Chirania et al. |
| 7,126,372 B2 | 10/2006 | Vadi et al. |
| 7,126,856 B2 | 10/2006 | Sun et al. |
| 7,129,746 B1 | 10/2006 | Balasubramanian et al. |
| 7,135,886 B2 | 11/2006 | Schlacter |
| 7,136,308 B2 | 11/2006 | Kant et al. |

| | | |
|---|---|---|
| 7,138,827 B1 | 11/2006 | Trimberger |
| 7,143,329 B1 | 11/2006 | Trimberger et al. |
| 7,145,829 B1 | 12/2006 | Kim et al. |
| 7,154,299 B2 | 12/2006 | Swami et al. |
| 7,167,025 B1 | 1/2007 | Schmit et al. |
| 7,193,440 B1 | 3/2007 | Schmit et al. |
| 7,200,235 B1 | 4/2007 | Trimberger |
| 7,203,100 B2 | 4/2007 | Kant et al. |
| 7,209,404 B2 | 4/2007 | Chen et al. |
| 7,212,448 B1 | 5/2007 | Trimberger |
| 7,218,137 B2 | 5/2007 | Vadi et al. |
| 7,224,181 B1 | 5/2007 | Schmit et al. |
| 7,224,182 B1 | 5/2007 | Hutchings et al. |
| 7,230,869 B1 | 6/2007 | Redgrave et al. |
| 7,236,009 B1 | 6/2007 | Rohe et al. |
| 7,268,586 B1 | 9/2007 | Redgrave |
| 7,272,031 B1 | 9/2007 | Redgrave |
| 7,276,933 B1 | 10/2007 | Teig et al. |
| 7,295,037 B2 | 11/2007 | Schmit et al. |
| 7,304,904 B2 | 12/2007 | Lambrache et al. |
| 7,310,757 B2 | 12/2007 | Ngo et al. |
| 7,317,331 B2 | 1/2008 | Teig et al. |
| 7,325,179 B2 | 1/2008 | Sasakura |
| 7,328,384 B1 | 2/2008 | Kulkarni et al. |
| 7,330,050 B2 | 2/2008 | Redgrave |
| 7,342,415 B2 | 3/2008 | Teig et al. |
| 7,417,918 B1 | 8/2008 | Hao et al. |
| 7,420,389 B2 | 9/2008 | Schmit et al. |
| 7,424,655 B1 | 9/2008 | Trimberger |
| 7,425,841 B2 | 9/2008 | Schmit et al. |
| 7,443,196 B2 | 10/2008 | Redgrave et al. |
| 7,492,187 B2 | 2/2009 | Kamp et al. |
| 7,493,511 B1 | 2/2009 | Yin et al. |
| 7,521,958 B2 | 4/2009 | Hutchings et al. |
| 7,525,342 B2 | 4/2009 | Teig et al. |
| 7,525,835 B2 | 4/2009 | Redgrave |
| 7,529,992 B1 | 5/2009 | Teig et al. |
| 7,530,033 B2 | 5/2009 | Caldwell et al. |
| 7,532,030 B2 | 5/2009 | Redgrave |
| 7,532,032 B2 | 5/2009 | Schmit et al. |
| 7,535,252 B1 | 5/2009 | Teig et al. |
| 7,545,167 B2 | 6/2009 | Teig et al. |
| 7,570,077 B2 | 8/2009 | Redgrave |
| 7,576,564 B2 | 8/2009 | Schmit et al. |
| 7,587,698 B1 | 9/2009 | Rohe et al. |
| 7,610,566 B1 | 10/2009 | Caldwell et al. |
| 7,616,027 B2 | 11/2009 | Schmit et al. |
| 7,656,188 B2 | 2/2010 | Teig et al. |
| 7,667,486 B2 | 2/2010 | Schmit et al. |
| 7,669,097 B1 | 2/2010 | Teig et al. |
| 7,696,780 B2 | 4/2010 | Hutchings et al. |
| 7,804,730 B2 | 9/2010 | Redgrave et al. |
| 7,825,685 B2 | 11/2010 | Chandler et al. |
| 7,825,687 B2 | 11/2010 | Redgrave |
| 7,872,496 B2 | 1/2011 | Schmit et al. |
| 7,898,291 B2 | 3/2011 | Rohe et al. |
| 7,928,761 B2 | 4/2011 | Voogel et al. |
| 7,948,266 B2 | 5/2011 | Schmit et al. |
| 2001/0007428 A1 | 7/2001 | Young et al. |
| 2001/0013797 A1 | 8/2001 | Hirairi |
| 2001/0038552 A1 | 11/2001 | Ishimaru |
| 2002/0008541 A1 | 1/2002 | Young et al. |
| 2002/0010853 A1 | 1/2002 | Trimberger et al. |
| 2002/0049955 A1 | 4/2002 | Yamashita et al. |
| 2002/0113619 A1 | 8/2002 | Wong |
| 2002/0125910 A1 | 9/2002 | New et al. |
| 2002/0125914 A1 | 9/2002 | Kim |
| 2002/0157071 A1 | 10/2002 | Schiefele et al. |
| 2002/0161568 A1 | 10/2002 | Sample et al. |
| 2002/0163357 A1 | 11/2002 | Ting |
| 2003/0042931 A1 | 3/2003 | Ting |
| 2003/0080777 A1 | 5/2003 | Baxter |
| 2003/0101419 A1 | 5/2003 | Yamashita et al. |
| 2003/0110430 A1 | 6/2003 | Bailis et al. |
| 2003/0122578 A1 | 7/2003 | Masui et al. |
| 2004/0010767 A1 | 1/2004 | Agrawal et al. |
| 2004/0103265 A1 | 5/2004 | Smith |
| 2004/0105207 A1 | 6/2004 | Spaderna et al. |
| 2004/0196066 A1 | 10/2004 | Ting |

| | | | |
|---|---|---|---|
| 2004/0222817 A1 | 11/2004 | Madurawe | |
| 2004/0233758 A1 | 11/2004 | Kim et al. | |
| 2005/0125478 A1* | 6/2005 | Ng | 708/620 |
| 2005/0128789 A1 | 6/2005 | Houston | |
| 2005/0134308 A1 | 6/2005 | Okada et al. | |
| 2005/0254315 A1 | 11/2005 | Salters | |
| 2006/0158217 A1 | 7/2006 | Madurawe | |
| 2006/0250168 A1 | 11/2006 | Starr et al. | |
| 2007/0075737 A1 | 4/2007 | Schmit et al. | |
| 2007/0143577 A1 | 6/2007 | Smith | |
| 2007/0241777 A1 | 10/2007 | Schmit et al. | |
| 2007/0241791 A1 | 10/2007 | Schmit et al. | |
| 2007/0242529 A1 | 10/2007 | Redgrave et al. | |
| 2007/0257700 A1 | 11/2007 | Caldwell et al. | |
| 2007/0257702 A1 | 11/2007 | Hutchings et al. | |
| 2007/0285125 A1 | 12/2007 | Redgrave | |
| 2007/0286008 A1 | 12/2007 | Redgrave | |
| 2008/0030227 A1 | 2/2008 | Teig et al. | |
| 2008/0036494 A1 | 2/2008 | Teig et al. | |
| 2008/0100339 A1 | 5/2008 | Schmit et al. | |
| 2008/0164906 A1 | 7/2008 | Redgrave | |
| 2008/0180131 A1 | 7/2008 | Teig et al. | |
| 2009/0146686 A1 | 6/2009 | Voogel et al. | |
| 2009/0167345 A1 | 7/2009 | Voogel et al. | |
| 2009/0172351 A1 | 7/2009 | Vorbach et al. | |
| 2009/0196602 A1 | 8/2009 | Saunders et al. | |
| 2009/0243651 A1 | 10/2009 | Caldwell et al. | |
| 2010/0194429 A1 | 8/2010 | Teig et al. | |
| 2010/0219859 A1 | 9/2010 | Schmit et al. | |
| 2011/0018582 A1 | 1/2011 | Chandler et al. | |

FOREIGN PATENT DOCUMENTS

WO    WO 2009/035586    3/2009

OTHER PUBLICATIONS

U.S. Appl. No. 12/058,662, filed Mar. 28, 2008, Caldwell, Andrew, et al.
U.S. Appl. No. 11/081,855, filed Mar. 15, 2005, Schmit, Herman, et al.
U.S. Appl. No. 11/751,629, filed May 21, 2007, Rohe, Andre, et al.
U.S. Appl. No. 11/390,973, filed Mar. 27, 2006, Teig, Steven, et al.
U.S. Appl. No. 11/391,000, filed Mar. 27, 2006, Teig, Steven, et al.
U.S. Appl. No. 11/754,263, filed May 25, 2007, Teig, Steven, et al.
U.S. Appl. No. 11/754,264, filed May 25, 2007, Caldwell, Andrew, et al.
Notice of Allowance of U.S. Appl. No. 10/883,486, mailing date May 2, 2008, Schmit, Herman, et al.
Notice of Allowance of U.S. Appl. No. 10/883,486, mailing date Nov. 5, 2007, Schmit, Herman, et al.
Final Office Action of U.S. Appl. No. 10/883,486, mailing date Jul. 12, 2007, Schmit, Herman, et al.
Advisory Action of U.S. Appl. No. 10/883,486, mailing date Jan. 5, 2007, Schmit, Herman, et al.
Final Office Action of U.S. Appl. No. 10/883,486, mailing date Oct. 4, 2006, Schmit, Herman, et al.
Non-Final Office Action of U.S. Appl. No. 10/883,486, mailing date Feb. 10, 2006, Schmit, Herman, et al.
Notice of Allowance of U.S. Appl. No. 10/882,946, mailing date Sep. 28, 2006, Schmit, Herman, et al.
Final Office Action of U.S. Appl. No. 10/882,946, mailing date Jun. 5, 2006, Schmit Herman, et al.
Non-Final Office Action of U.S. Appl. No. 10/882,946, mailing date Oct. 26, 2005, Schmit, Herman, et al.
Final Office Action of U.S. Appl. No. 11/617,671, mailing date Mar. 31, 2008, Schmit, Herman, et al.
Non-Final Office Action of U.S. Appl. No. 11/617,671, mailing date Aug. 15, 2007, Schmit, Herman, et al.
Notice of Allowance of U.S. Appl. No. 10/883,051, mailing date Sep. 7, 2006, Schmit, Herman, et al.
Final Office Action of U.S. Appl. No. 10/883,051, mailing date Apr. 3, 2006, Schmit, Herman, et al.
Non-Final Office Action of U.S. Appl. No. 10/883,051, mailing date Oct. 26, 2005, Schmit, Herman, et al.
Non-Final Office Action of U.S. Appl. No. 11/608,790, mailing date Mar. 21, 2008, Schmit, Herman, et al.

Notice of Allowance of U.S. Appl. No. 11/081,874, mailing date May 8, 2007, Redgrave, Jason.
Final Office Action of U.S. Appl. No. 11/081,874, mailing date Nov. 27, 2006, Redgrave, Jason.
Non-Final Office Action of U.S. Appl. No. 11/081,874, mailing date Apr. 19, 2006, Redgrave, Jason.
Final Office Action of U.S. Appl. No. 11/845,028, mailing date Aug. 29, 2008, Redgrave, Jason.
Non-Final Office Action of U.S. Appl. No. 11/845,028, mailing date Jan. 24, 2008, Redgrave, Jason.
Notice of Allowance of U.S. Appl. No. 11/081,870, mailing date Jan. 26, 2007, Redgrave, Jason, et al.
Final Office Action of U.S. Appl. No. 11/081,870, mailing date Oct. 6, 2006, Redgrave, Jason, et al.
Non-Final Office Action of U.S. Appl. No. 11/081,870, mailing date May 9, 2006, Redgrave, Jason, et al.
Final Office Action of U.S. Appl. No. 11/745,442, mailing date Aug. 11, 2008, Redgrave, Jason, et al.
Non-Final Office Action of U.S. Appl. No. 11/745,442, mailing date Dec. 28, 2007, Redgrave, Jason, et al.
Notice of Allowance U.S. Appl. No. 11/082,230, mailing date Apr. 2, 2007, Redgrave, Jason.
Non-Final Office Action of U.S. Appl. No. 11/082,230, mailing date Oct. 3, 2006, Redgrave, Jason
Restriction Requirement of U.S. Appl. No. 11/781,224, mailing date Aug. 6, 2008, Redgrave, Jason.
Notice of Allowance of U.S. Appl. No. 11/082,203, mailing date Sep. 6, 2007, Redgrave, Jason.
Notice of Allowance of U.S. Appl. No. 11/082,203, mailing date May 3, 2007, Redgrave, Jason.
Non-Final Office Action of U.S. Appl. No. 11/082,203, mailing date Jan. 5, 2007, Redgrave, Jason.
Non-Final Office Action of U.S. Appl. No. 11/390,973, mailing date Jun. 27, 2008, Teig, Steven, et al.
Non-Final Office Action of U.S. Appl. No. 11/391,000, mailing date Jul. 10, 2008, Teig, Steven, et al.
Non-Final Office Action U.S. Appl. No. 11/754,263, mailing date Jun. 25, 2008, Teig, Steven, et al.
"§3 Programmable Logic Devices," *Digital System Design*, 2001 Month N/A, slides 3.1-3.28.
"Design for Low Power in Actel Antifuse FPGAs", Actel Application Note, 2000 Actel Corporation, Sep. 2000, pp. 1-8.
"The Xilinx Virtex Series FPGA," Jan. 22, 2001, slides 1-22.
"Unifying Sequential and Spatial Computing with a Single Instruction Set Architecture," *ISCA '04*, Jun. 19-23, 2004, ACM, Munchen, Oberbayern, Germany.
Agrawal, O., et al., "An Innovative, Segmented High Performance FPGA Family with Variable-Grain-Architecture and Wide-gating Functions," *FPGA 99*, Feb. 1999, pp. 17-26, ACM, Monterey, CA.
Ahmed, E., et al., "The Effect of LUT and Cluster Size on Deep-Submicron FPGA Performance and Density," *FPGA 2000*, Feb. 2000, ACM, Monterey, CA.
Altera Corp., "6. DSP Blocks in Stratix II Devices," *SII52006-1.0*, Feb. 2004, pp. 1-32.
Altera, "Stratix II DSP Performance," *White Paper*, Feb. 2004, pp. 1-9, ver. 1.0, Altera Corporation, San Jose, CA.
Amerson, R., et al., "Plasma: An FPGA for Million Gate Systems," *Proceedings of the 1996 ACM 4th International Symposium on FPGAs*, Feb. 11-13, 1996, pp. 10-16, Monterey, CA.
Backus, J., "Can Programming be Liberated from the Von Neumann Style? A Functional Style and its Algebra of Programs," *Communications of the ACM*, Aug. 1978, pp. 613-641, vol. 21, No. 8, ACM.
Barker, R., "QuickSilver ACM SilverStream Design Methodology with the Inspire SDK Tool Set," *A Technology Application Whitepaper*, Jan. 26, 2004, pp. 1-8, QuickSilver Technology, Inc., San Jose, CA.
Butts, M., "Future Directions of Dynamically Reprogrammable Systems," *IEEE 1995 Custom Integrated Circuits Conference*, May 1995, pp. 487-494, IEEE.
Camposano, R., "The Growing Semiconductor Zoo: ASICs, CSSP, ASSP, ASIP, Structured Arrays, FPGAs, Processor Arrays, Platforms . . . and Other Animalia," Aug. 29 2003, pp. 1-74, Synopsys, Inc.
Caspi, E., et al., "A Streaming Multi-Threaded Model," *MSP-3*, Dec. 2, 2001, pp. 1-23.
Caspi, E., et al., "Stream Computations Organized for Reconfigurable Execution (SCORE): Introduction and Tutorial," Aug. 25, 2000, pp. 1-31, Version 1.0.
Compton, K., et al., "An Introduction to Reconfigurable Computing," *IEEE Computer*, Apr. 2000.
Compton, K., et al., "Reconfigurable Computing: A Survey of Systems and Software," *ACM Computing Surveys*, Jun. 2002, pp. 171-210, vol. 34, No. 2, ACM, New York, NY.
Cong, J., et al., "Combinational Logic Synthesis for LUT Based Field Programmable Gate Arrays," *ACM Transactions on Design Automation of Electronic Systems*, Apr. 1996, pp. 145-204, vol. 1, No. 2, ACM, Inc.
Davare, A., et al., "The Best of Both Worlds: The Efficient Asynchronous Implementation of Synchronous Specifications," *DAC '04*, Jun. 7-11, 2004, ACM, San Diego, CA.
Dehon, A., "Balancing Interconnect and Computation in a Reconfigurable Computing Array (or, why don't you really want 100% LUT utilization)," *Proceedings of the International Symposium on Field Programmable Gate Arrays*, Feb. 1999, pp. 125-134.
Dehon, A., "DPGA Utilization and Application," *Proceedings of the 1996 ACM Fourth International Symposium on Field-Programmable Gate Arrays FPGA*, Feb. 11-13, 1996, Monterey, CA.
Dehon, A., "Dynamically Programmable Gate Arrays: A Step Toward Increased Computational Density, *Proceedings of the Fourth Canadian Workshop on Field-Programmable Devices*," May 1996, pp. 47-54.
Dehon, A., "Reconfigurable Architectures for General-Purpose Computing," *A.I. Technical Report* No. 1586, Oct. 1996, pp. i-353.
Dehon, A., "The Density Advantage of Configurable Computing," Apr. 2000, pp. 41-49, IEEE.
Dehon, A., "Transit Note #121: Notes on Programmable Interconnect," *M.I.T. Transit Project*, Feb. 1995, pp. 1-13.
Dehon, A., et al., "Design Patterns for Reconfigurable Computing," *Proceedings of the IEEE Symposium on Field-Programmable Custom Computing Machines*, Apr. 2004.
Dehon, A., et al., "DPGA-Coupled Microprocessors: Commodity ICs for the Early $21^{st}$ Century," *FCCM '94-IEEE Workshop on FPGAs for Custom Computing Machines*, Apr. 1994, Napa Valley, CA.
Dehon, A., et al., "Reconfigurable Computing: What, Why, and Implications for Design Automation," *DAC* 1999, Jun. 1999, ACM, New Orleans, LA.
Enzler, R., et al., "Virtualizing Hardware with Multi-Context Reconfigurable Arrays," *Lecture Notes in Computer Science*, Sep. 2003, pp. 151-160.
Gayasen, A., et al., "Reducing Leakage Energy in FPGAs Using Region-Constrained Placement," *FPGA '04*, Feb. 22-24, 2004, pp. 51-58, ACM, Monterey, CA.
George, V., "Low Energy Field-Programmable Gate Array," *A Dissertation Submitted in Partial Satisfaction o the Requirements for the Degree of Doctor of Philosophy in Engineering-Electrical Engineering and Computer Sciences in the Graduate Division of the University of California, Berkeley*, Fall 2000 Month N/A, pp. 1-190.
Giraud-Carrier, C., "A Reconfigurable Data Flow Machine for Implementing Functional Programming Languages", *SIGPLAN Notices*, Sep. 1994, vol. 29, No. 9, pp. 22-28.
Goldstein, S.C., et al., "PipeRench: A Coprocessor for Streaming Multimedia Acceleration", *In International Symposium on Computer Architecture (ISCA)*, pp. 28-39, May 1999.
Goldstein, S.C., et al., "PipeRench: A Reconfigurable Architecture and Compiler," Apr. 2000, pp. 70-77, IEEE.
Hauck, S., et al., "Montage: An FPGA for Synchronous and Asynchronous Circuits," *Field-Programmable Gate Arrays: Architectures and Tools for Rapid Prototyping*, 1993 Month N/A, Springer-Verlag, Berlin.
Hauck, S., et al., "Totem: Domain-Specific Reconfigurable Logic," *IEEE Transactions on VLSI Systems*, 2006 Month N/A, pp. 1-25.
Heidari, G., et al., "Introducing a Paradigm Shift in the Design and Implementation of Wireless Devices," *A Wireless Devices Whitepaper*, Apr. 28, 2004 but © 2003, pp. 1-10, QuickSilver Technology, Inc., San Jose, CA.

Hofstee, H.P., "Cell Broadband Engine Architecture from 20,000 Feet," Aug. 24, 2005, pp. 1-6.

Huang, A.S., "Tao: An Architecturally Balanced Reconfigurable Hardware Processor," *Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology*, May 23, 1997, pp. 1-86, 107-109.

IBM, "Cell Broadband Engine Architecture, Version 1.0," Aug. 8, 2005, pp. 1-319.

IBM, "SPU Application Binary Interface Specification, Version 1.3," *CBEA JSRE Series*, Aug. 1, 2005, pp. iv-26.

IBM, "SPU Assembly Language Specification, Version 1.2," *CBEA JSRE Series*, Aug. 1, 2005, pp. iii-22.

IBM, "SPU C/C++ Language Extensions, Version 2.0" *CBEA JSRE Series*, Aug. 1, 2005, pp. iv-84.

IBM, "Synergistic Processor Unit Instruction Set Architecture, Version 1.0," Aug. 1, 2005, pp. 1-257.

Kaviani, A., et al., "Computational Field Programmable Architecture," *Custom Integrated Circuits Conference, 1998, Proceedings of the IEEE 1998*, May 11-14, 1998.

Kaviani, A., et al., "Hybrid FPGA Architecture," *Proceedings of the 1996 ACM Fourth International Symposium on Field-Programmable Gate Arrays*, Feb. 11-13, 1996, pp. 3-9, Monterey, CA.

Keutzer, K., "Overview of *configurable* architectures," Feb. 28, 2002, slides 1-29.

Kocan, F., et al., "Logic Modules with Shared SRAM Tables for Field-Programmable Gate Arrays," *FPL 2004*, Aug./Sep. 2004, pp. 289-300, Springer-Verlag, Berlin Heidelberg.

Lehn, D.I., et al., "Evaluation of Rapid Context Switching on a CSRC Device," *Proceedings of the International Conference on Engineering of Reconfigurable Systems and Algorithms*, Jun. 24-27, 2002.

Lemieux, G., et al., "Generating Highly-Routable Sparse Crossbars for PLDs," *FPGA 2000*, Feb. 2000, ACM, Monterey, CA, USA.

Lemieux, G., et al., "Using Sparse Crossbars within LUT Clusters," *FPGA 2001*, Feb. 11-13, 2001, ACM, Monterey, CA.

Lertora, F., et al., "Handling Different Computational Granularity by a Reconfigurable IC Featuring Embedded FPGAs and a Network-On-Chip," *13th Annual IEEE Symposium on Field-Programmable Custom Computing Machines (FCCM 2005)* 2005, Apr. 18-20, 2005.

Lewis, D., et al., "The Stratix-II Routing and Logic Architecture," *Proceedings of the 2005 ACM SIGDA 13th International Symposium on Field-Programmable Gate Arrays*, pp. 1-22, Feb. 20-22, 2005, Monterey, CA.

Ling, A., "The Search for the Optimal FPGA Logic Block," 2001 Month N/A, ACM.

M2000, "FlexEOS Embedded FPGA Cores," 2003 Month N/A, M2000.

Markovskiy, Y., et al., "Analysis of Quasi-Static Scheduling Techniques in a Virtualized Reconfigurable Machine," *FPGA '02*, Feb. 24-26, 2002, ACM, Monterey, CA.

Master, P., "The Next Big Leap in Reconfigurable Systems," *A Technology Vision Whitepaper*, Apr. 28, 2004 but © 2003, pp. 1-8, QuickSilver Technology, Inc., San Jose, CA.

Mathstar, Inc., "MathStar FPOA Architecture: A New Approach to High Throughput, Scalable, and Reprogrammable Design," *Technology Overview*, 2003 Month N/A, MathStar, Inc.

Mirsky, E., et al., "MATRIX: A Reconfigurable Computing Architecture with Configurable Instruction Distribution and Deployable Resources," *Proceedings of the IEEE Workshop on FPGAs for Custom Computing Machines*, Apr. 1996.

Mirsky, E., et al., "MATRIX: A Reconfigurable Computing Device with Configurable Instruction Distribution and Deployable Resources (Extended Abstract)," *Hot Chips Symposium 1997*, Aug. 1997.

Morris, K., "Lattice Launches XP: Non-Volatility at the Forefront of FPGA," *FPGA and Programmable Logic Journal*, Mar. 1, 2005, pp. 1-5, Techfocus Media, Inc.

Morris, K., "Rationalizing Reconfigurability: The Importance of Being Programmable," *FPGA and Structured ASIC Journal*, Sep. 27, 2005.

Nelson, B.E., "Reconfigurable Computing: An Introduction and Overview," Sep. 23, 1998, pp. 1-43.

Ochotta, E.S., et al., "A Novel Predictable Segmented FPGA Routing Architecture," *FPGA 98*, Feb. 1998, pp. 3-11, ACM, Monterey, CA.

Ohkura, J., et al., "Dataflow in the Adaptive Computing Machine (ACM)," *A Technology Application Whitepaper*, Apr. 28, 2004 but © 2003, pp. 1-9, QuickSilver Technology, Inc., San Jose, CA.

Parhami, B., "Part IV: Low-Diameter Architectures," *ECE 254B: Advanced Computer Architecture: Parallel Processing, UCSB*, Spring 2005 Month N/A, slides 1-93, Behrooz Parhami, Santa Barbara, CA.

Patel, C., et al., "An Architectural Exploration of Via Patterned Gate Arrays," *Proceedings of the 2003 International Symposium on Physical Design*, Apr. 6-9, 2003, pp. 184-189, Monterey, CA.

Pedram, M., "IEEE Circuits and Systems Society Distinguished Lecturer Program." (NPL Date Unknown).

Pedram, M., et al., "A New Design for Double Edge Triggered Flip-flops", Feb. 10-13, 1998.

Perissakis, S., et al., "Embedded DRAM for a Reconfigurable Array," *Proceedings of the 1999 Symposium on VLSI Circuits*, Jun. 1999, slides 1-24.

Perissakis, S., et al., "Embedded DRAM for a Reconfigurable Array," *Proceedings of the 1999 Symposium on VLSI Circuits*, Jun. 1999.

Plunkett, B., "In Search of the SDR Holy Grail," *A Technology Application Whitepaper*, Apr. 28, 2004 but © 2003, pp. 1-7, QuickSilver Technology, Inc., San Jose, CA.

Plunkett, B., et al., "Adapt2400 ACM Architecture Overview," *A Technology Whitepaper*, 2004 Month N/A, pp. 1-9, QuickSilver Technology, Inc.

Quicklogic Corp., "Ultra-Low Power FPGA Combining Performance, Density, and Embedded RAM", *Eclipse II Family Data Sheet*, Nov. 2005, pp. 1-92, QuickLogic Corporation, US.

Quicksilver Technology, Inc., "Adapt2000 ACM System Platform," Apr. 2004, pp. 1-39, QuickSilver Technology, Inc., San Jose, CA.

Quicksilver Technology, Inc., "InSpire SDK Tool Set," *Product Brief*, 2004 Month N/A, QuickSilver Technology, Inc., San Jose, CA.

Quicksilver Technology, Inc., "QS2412 Adaptive Computing Machine," *Product Brief*, 2004 Month N/A, QuickSilver Technology, Inc., San Jose, CA.

Rahman, A., et al., "Wiring Requirement and Three-Dimensional Integration Technology for Field Programmable Gate Arrays," *IEEE Transactions on Very Large Scale Integration (VLSI) Systems*, Feb. 2003, pp. 44-54, vol. 11, No. 1, IEEE.

Rose, J., "Hard vs. Soft: The Central Question of Pre-Fabricated Silicon," *34th International Symposium on Multiple-Valued Logic (ISMVL '04)*, May 2004, pp. 2-5.

Sambhwani, S., et al., "Implementing W-CDMA Transceiver Structure on an Adaptive Computing Platform," *A Technology Application Whitepaper*, Apr. 28, 2004 but © 2003, pp. 1-12, QuickSilver Technology, Inc., San Jose, CA.

Scalera, S.M., et al., "A Mathematical Benefit Analysis of Context Switching Reconfigurable Computing," *Proceedings of the 5th Reconfigurable Architectures Workshop (RAW)*, Mar. 30, 1998, vol. 1388 of *Lecture Notes in Computer Science*, pp. 73-78.

Schaumont, P., et al., "A Quick Safari Through the Reconfiguration Jungle," *38th Design Automation Conference*, Jun. 2001, pp. 172-177, Las Vegas, NV.

Schmit, H., "Extra-Dimensional Island-Style FPGAs," *Field Programmable Logic and Application (FPL 2003)*, Sep. 2003, pp. 406-415.

Schmit, H., "Extra-dimensional Island-Style FPGAs," *Field Programmable Logic and Application (FPL 2003)*, Sep. 2003, slides 1-26.

Schmit, H., "Incremental Reconfiguration for Pipelined Applications," *Proceedings of the 5th IEEE Symposium on FPGA-Based Custom Computing Machines*, Apr. 16-18 1997.

Schmit, H., et al., "FPGA Switch Block Layout and Evaluation," *FPGA '02*, Feb. 24-26, 2002, ACM, Monterey, CA.

Schmit, H., et al., "PipeRench: A Virtualized Programmable Datapath in 0.18 Micron Technology," *Proceedings of the IEEE 2002 Custom Integrated Circuits Conference*, May 12-15, 2002, pp. 63-66.

Schmit, H., et al., "Queue Machines: Hardware Compilation in Hardware," *Proceedings of the 10th Annual IEEE Symposium on Field-Programmable Custom Computing Machines*, Apr. 22-24, 2002.

Sharma, A., et al., "Accelerating FPGA Routing Using Architecture-Adaptive A* Techniques," *Proceedings of the IEEE Conference on Field-Programmable Technology 2005*, Dec. 11-14, 2005.

Singh, A., et al., "Interconnect Pipelining in a Throughput-Intensive FPGA Architecture," *FPGA 2001*, Feb. 11-13, 2001, pp. 153-160, ACM, Monterey, CA.

Singh, A., et al., "PITIA: An FPGA for Throughput-Intensive Applications," *IEEE Transactions on Very Large Scale Integration (VLSI) Systems*, Jun. 2003, pp. 354-363, vol. 11, No. 3, IEEE.

Slade, A.L., et al., "Reconfigurable Computing Application Frameworks," *11th Annual IEEE Symposium on Field-Programmable Custom Computer Machines*, Apr. 9-11, 2003.

Snider, G., "Performance-Constrained Pipelining of Software Loops onto Reconfigurable Hardware," *FPGA '02*, Feb. 24-26, 2002, pp. 177-186, ACM, Monterey, CA.

Tau, E., et al., "A First Generation DPGA Implementation," *Proceedings of the Third Canadian Workshop on Field-Programmable Devices*, May 1995, pp. 138-143.

Tau, E., et al., "Transit Note #114: A First Generation DPGA Implementation," *M.I.T. Transit Project*, Jan. 1995, pp. 1-8.

Taylor, R., et al., "Enabling Energy Efficiency in Via-Patterned Gate Array Devices", *Proceedings of the 41st annual conference on Design automation*, Jun. 7-11, 2004, San Diego, CA.

Teifel, J., et al., "Highly Pipelined Asynchronous FPGAs," *Proceedings of the 2004 ACM/SIGDA 12th International Symposium on Field Programmable Gate Arrays*, Feb. 22-24, 2004, ACM, Monterey, CA.

Tessier, R., et al., "Balancing Logic Utilization and Area Efficiency in FPGAs," *Proceedings of the Roadmap to Reconfigurable Computing, 10th International Workshop on Field Programmable Logic and Applications*, Aug. 27-30, 2000, pp. 535-544.

Tom, M., et al., "Clustering of Large Designs for Channel-Width Constrained FPGAs," *University of British Columbia, Department of Electrical and Computer Engineering*, Jun. 2005, slides 1-39, Vancouver, British Columbia, Canada.

Tom, M., et al., "Logic Block Clustering of Large Designs for Channel-Width Constrained FPGAs" *DAC 2005*, Jun. 13-17, 2005, pp. 726-731, ACM, Anaheim, CA.

Tong, K.T., et al., "Regular Logic Fabrics for a Via Patterned Gate Array (VPGA)," *Proceedings of the IEEE 2003 Custom Integrated Circuits Conference 2003*, Sep. 21-24, 2003.

Trimberger, S., "Effects of FPGA Architecture on FPGA Routing," *32nd ACM/IEEE Design Automation Conference*, Jun. 1995, ACM.

Tsu, W., et al., "HSRA: High-Speed, Hierarchical Synchronous Reconfigurable Array," *Proceedings of the International Symposium on Field Programmable Gate Arrays*, Feb. 1999, pp. 69-78.

Wawrzynek, J., "EECS150-Digital Design: Lecture 5—Field Programmable Gate Arrays (FPGAs)," Feb. 4, 2002, slides 1-20.

Weaver, N., et al., "The SFRA: A Corner-Turn FPGA Architecture," *FPGA '04*, Feb. 22-24, 2004, ACM, Monterey, CA.

Wilton, S.J.E., "Memory-to-Memory Connection Structures in FPGAs with Embedded Memory Arrays," *FPGA 97*, Feb. 1997, pp. 10-16, ACM, Monterey, CA.

Xilinx, Inc., "Virtex-4 Family Overview," *Advance Product Specification*, Sep. 10, 2004, pp. 21-30, v1.1, Xilinx, Inc.

Zhang, M., et al., "Design of Soft Error Tolerant Logic Circuits," *Ming Zhang, University of Illinois at Urbana-Champaign*, 2005, 2005, pp. 1-23.

Zilic, Z. et al., "Using BDDs to Design ULMs for FPGAs," *Proceedings of the 1996 ACM Fourth International Symposium on Field-Programmable Gate Arrays (FPGA '96)*, Feb. 11-13, 1996, pp. 1-10, Monterey, CA.

Zuchowski, P.S., "A Hybrid ASIC and FPGA Architecture," 2002 Month N/A, IEEE.

U.S. Appl. No. 12/676,892, filed Mar. 5, 2010, Chandler, Trevis, et al.
U.S. Appl. No. 12/897,778, filed Oct. 4, 2010, Chandler, Trevis, et al.
U.S. Appl. No. 12/901,487, filed Oct. 8, 2010, Redgrave, Jason.
Updated portions of prosecution history of U.S. Appl. No. 10/883,486, Mailed Aug. 4, 2008, Schmit, Herman et al.
Portions of prosecution history of U.S. Appl. No. 12/200,867, Mailed Dec. 3, 2010, Schmit, Herman, et al.
Updated portions of prosecution history of U.S. Appl. No. 10/882,946, Mailed Sep. 28, 2006, Schmit, Herman, et al.
Updated portions of prosecution history of U.S. Appl. No. 11/617,671, Mailed Jun. 23, 2009, Schmit, Herman, et al.
Updated portions of prosecution history of U.S. Appl. No. 10/883,051, Mailed Sep. 7, 2006, Schmit, Herman, et al.
Updated portions of prosecution history of U.S. Appl. No. 11/608,790, Mailed Sep. 30, 2009, Schmit, Herman, et al.
Portions of prosecution history of U.S. Appl. No. 12/685,673, Mailed Mar. 29, 2011, Schmit, Herman, et al.
Updated portions of prosecution history of U.S. Appl. No. 11/081,874, Mailed May 8, 2007, Redgrave, Jason.
Updated portions of prosecution history of U.S. Appl. No. 11/845,028, Mailed Dec. 15, 2008, Redgrave, Jason.
Updated portions of prosecution history of U.S. Appl. No. 11/081,870, Jan. 26, 2007, Redgrave, Jason, et al.
Updated portions of prosecution history of U.S. Appl. No. 11/745,442, Mailed Aug. 11, 2010, Redgrave, Jason, et al.
Updated portions of prosecution history of U.S. Appl. No. 11/082,230, Mailed Jul. 27, 2007, Redgrave, Jason.
Updated portions of prosecution history of U.S. Appl. No. 11/781,224, Mailed Dec. 30, 2008, Redgrave, Jason.
Updated portions of prosecution history of U.S. Appl. No. 11/082,203, Mailed Dec. 6, 2007, Redgrave, Jason.
Portions of prosecution history of U.S. Appl. No. 11/9663,771, Mailed Mar. 20, 2009, Redgrave, Jason.
Portions of prosecution history of U.S. Appl. No. 12/498,356, Mailed Sep. 9, 2010, Redgrave, Jason.
Updated portions of prosecution history of U.S. Appl. No. 11/390,973, Mailed Mar. 27, 2009, Redgrave, Jason.
Updated portions of prosecution history of U.S. Appl. No. 11/391,000, Mailed Sep. 29, 2009, Teig, Steven, et al.
Updated portions of prosecution history of U.S. Appl. No. 11/754,263, Mailed Jan. 5, 2009, Teig, Steven, et al.
Portions of prosecution history of U.S. Appl. No. 11/754,264 Mailed Jun. 11, 2009, Caldwell, Andrew, et al.
Portions of prosecution history of U.S. Appl. No. 12/206,718, Mailed Feb. 24, 2011, Voogel, Martin, et al.
Portions of prosecution history of U.S. Appl. No. 12/206,729, Mailed Sep. 28, 2010, Chandler, Trevis, et al.
Portions of prosecution history of U.S. Appl. No. 12/283,130, Mailed Dec. 9, 2010, Voogel, Martin, et al.
International Search Report of PCT/US2008/010526, Dec. 10, 2008 (mailing date), Tabula, Inc.
Written Opinion of PCT/US2008/010526, Dec. 10, 2008 (mailing date), Tabula, Inc.
International Preliminary Report on Patentability of PCT/US2008/010526, Mar. 9, 2010 (issuance date), Tabula, Inc.
Mandal, C., et al., "Use of Multi-port Memories in Programmable Structures for Architectural Synthesis," *Proceedings of 8th Annual IEEE International Innovative Systems in Silicon*, Oct. 9-11, 1996, pp. 341-351.
Soviani, C., et al., "Optimizing Sequential Cycles through Shannon Decomposition and Retiming", Design, Automation, and Test in Europe, Mar. 10, 2006, pp. 1085-1090.
U.S. Appl. No. 12/965,812, filed Dec. 10, 2010, Schmit, Herman, et al.
U.S. Appl. No. 13/083,491, filed Apr. 8, 2011, Schmit, Herman, et al.
U.S. Appl. No. 13/089,256, filed Apr. 18, 2011, Voogel, Martin, et al.
Portions of prosecution history of U.S. Appl. No. 12/897,778, Mailed Mar. 31, 2011, Chandler, Trevis, et al.
Updated portions of prosecution history of U.S. Appl. No. 12/283,130, Mailed May 9, 2011, Voogel, Martin, et al.
"The Effect of SRAM Table Sharing and Cluster Size on FPGA Area," NPL Date Unknown, pp. 1-10.
Niedzielski, D., "An Overview of Reconfigurable Computing," NPL Date Unknown.
Patel, C., et al., "An Architectural Exploration of Via Patterned Gate Arrays," Carnegie Mellon University Center for Silicon System Implementation, NPL Date Unknown, slides 1-23.
Zhang, M., et al., "Design of Soft Error Tolerant Logic Circuits," pp. 1-4. (NPL Date Unknown).

* cited by examiner

| Current 3 bits of the multiplier | Comments | Required Action |
|---|---|---|
| 000 | Middle of run of 0s | Do nothing (or add zero) |
| 001 | End of run of 1s | Add multiplicand |
| 010 | Singleton 1 | Add multiplicand |
| 011 | End of a run of 1s | Add two times the multiplicand |
| 100 | Beginning of run of 1s | Subtract two times the multiplicand |
| 101 | End of run of 1s, beginning of another run of 1s | Subtract multiplicand |
| 110 | Beginning of run of 1s | Subtract multiplicand |
| 111 | Middle of run of 1s | Do nothing (or add zero) |

*Figure 9*

METHOD AND APPARATUS FOR PERFORMING AN OPERATION WITH A PLURALITY OF SUB-OPERATIONS IN A CONFIGURABLE IC

CLAIM OF BENEFIT TO PRIOR APPLICATIONS

This application claims benefit to U.S. Provisional Patent Application 61/066,135, entitled "Configurable ICs that Conditionally Transition through Configuration Data Sets," filed on Mar. 22, 2007.

CROSS REFERENCE TO RELATED APPLICATIONS

This Application is related to the following concurrently filed and commonly owned U.S. Applications: U.S. patent application Ser. No. 11/754,263, filed May 25, 2007, entitled "Configurable ICs That Conditionally Transition Through Configuration Data Sets", now U.S. Pat. No. 7,535,252; and U.S. patent application Ser. No. 11/754,264, filed May 25, 2007, entitled "Method and Apparatus for Function Decomposition", now U.S. Pat. No. 7,610,566.

FIELD OF THE INVENTION

The present invention is directed towards reconfigurable ICs and more specifically towards a reconfigurable IC that conditionally performs operations.

BACKGROUND OF THE INVENTION

An IC is a device that includes numerous electronic components (e.g., transistors, resistors, diodes, etc.) that are embedded typically on the same substrate, such as a single piece of semiconductor wafer. These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of substrate or wafer.

The use of configurable integrated circuits ("ICs") has dramatically increased in recent years. One example of a configurable IC is a field programmable gate array ("FPGA"). An FPGA is a field programmable IC that often has logic circuits, interconnect circuits, and input/output (I/O) circuits. The logic circuits (also called logic blocks) are typically arranged as an internal array of circuits. These logic circuits are typically connected together through numerous interconnect circuits (also called interconnects). The logic and interconnect circuits are often surrounded by the I/O circuits. Like some other configurable ICs, the logic circuits and interconnect circuits of an FPGA are configurable.

FPGAs have become popular as their configurable logic and interconnect circuits allow the FPGAs to be adaptively configured by system manufacturers for their particular applications. Also, in recent years, several configurable ICs have been suggested that are capable of reconfiguration at runtime. However, there has not been much innovation regarding ICs that can configure one or more times during one clock cycle. Consequently, most reconfigurable ICs take several cycles (e.g., tens, hundreds, or thousands of cycles) to reconfigure.

Recently, there have been configurable ICs that can configure at least once during each clock cycle. Ideally, the configurable IC can configure multiple times during sub-cycles within one clock cycle. See, e.g., the U.S. patent application Ser. No. 10/883,276 entitled "Configurable Circuits, IC's, and Systems", filed on Jun. 3, 2004, now U.S. Pat. No. 7,109,752. Such configurability would have many advantages, such as enabling an IC to perform numerous functions within any given clock cycle. Such a reconfigurable IC may contain reconfigurable logic circuits that can perform different functions in different sub-cycles. There are also many applications today that require different functions to be performed on the same set of inputs based on a certain condition that is only determined during runtime. There is, therefore, a need in the art to make a reconfigurable IC that can conditionally perform different functions on the same set of input based on a user-design signal.

SUMMARY OF THE INVENTION

Some embodiments provide a reconfigurable IC with at least one reconfigurable circuit that conditionally transitions through configuration data sets. In some embodiments, the reconfigurable circuit transitions through configuration data sets based on a user-design signal. In some embodiments, at least one reconfigurable circuit conditionally performs different operations on the same set of inputs.

Some embodiments provide a method of operating a configurable circuit of an integrated circuit (IC). The method performs a first operation by the configurable circuit based on a first configuration data set. The method generates a user-design signal within the IC. When the user-design signal has a value from a set of values, the method performs a second operation by the configurable circuit based on a second configuration data set, after the first operation. When the user-design signal does not have a value from said set of values, the method performs a third operation by the configurable circuit based on a third configuration data set, after the first operation. In some embodiments, the first, second, and third configuration data sets are supplied to the configurable circuit by a selection circuit that receives a selection signal based on the user-design signal. In some embodiments, the selection signal is generated by a signal generator that receives the user-design signal and generates the selection signal based on the user-design signal. In some embodiments, the user-design signal is a non-repetitive, non-clock signal.

Some embodiments provide a reconfigurable integrated circuit (IC) that includes a set of reconfigurable circuits and sets of configuration storage elements. Each set of configuration storage elements is associated with one reconfigurable circuit. Each set of configuration storage elements stores several configuration data sets. Each configuration data set defines a set of operations that a reconfigurable circuit performs. At least one reconfigurable circuit receives a first sub-set of its configuration data when a user-design signal has a first value and receives a second sub-set of its configuration data when the user-design signal has a second value. In some embodiments, the reconfigurable IC also includes a set of selection circuits. Each selection circuit can supply several configuration data sets from the configuration storage elements to each reconfigurable circuit. At least one selection circuit conditionally supplies configuration data sets to the at least one reconfigurable circuit based on the user-design signal.

Some embodiments provide a method of performing a mathematical operation on a set of operands. The mathematical operation includes several sub-operations. The method examines several bits of at least one operand at a time and depending on the value of these bits, reconfigures a single logic circuit to perform one of the sub-operations to generate a partial result of the mathematical operation. In some embodiments, the logic circuit is reconfigured by receiving a first set of configuration data that cause the logic circuit to reconfigure to perform a first sub-operation operation and a second set of configuration data that cause the logic circuit to reconfigure to perform a second sub-operation. In some embodiments, the logic circuit receives different inputs based on the value of the bits being examined. In some embodiments, the mathematical operation is multiplication and the sub-operations are addition and subtraction.

Some embodiments provide a reconfigurable integrated circuit ("IC") that can perform multiplication. The IC includes a first reconfigurable logic circuit and a signal generator that can generate a selection signal based on a value of a particular number of bits of a multiplier. The IC also includes a first selection circuit that ca supply several configuration data sets for the first reconfigurable circuit based on the selection signal. The reconfigurable logic circuit is reconfigured to perform either an addition operation or a subtraction operation to generate a partial result of the multiplication. In some embodiments, the IC also includes a second reconfigurable circuit that can supply several inputs to the first configurable circuits and a second selection circuit that can supply several configuration data sets for the second reconfigurable circuit based on the selection signal. Based on the selection signal, the second reconfigurable circuit supplies either a value of a multiplicand, twice the value of the multiplicand, or a value of 0 as input to the first reconfigurable circuit.

Some embodiments provide a method of performing circuit synthesis that receives a design that has a function with several inputs. The method identifies a set of early arriving inputs of the function and performs Shannon decomposition on the function based on one of the early arriving inputs. In some embodiments, the method estimates the number of circuits a signal has to travel through to reach each input of the function and selects a set of inputs with signals that travel through fewer numbers of circuits compared to signals of inputs that are not selected. In some embodiments in which the design has more than a particular number of inputs, the method recursively identifies early arriving signals and performs Shannon decomposition on the resulting functions until Shannon decomposition results in a set of functions all of which with fewer than a particular number of inputs.

Some embodiments provide a computer readable medium that stores a computer program that can perform circuit synthesis. The computer program is executable by at least one processor. The computer program includes sets of instructions for receiving a design comprising a function with a plurality of inputs, for identifying a set of early arriving inputs of the function, and for performing a function decomposition on the function based on one of the early arriving inputs.

BRIEF DESCRIPTION OF THE DRAWINGS

The novel features of the invention are set forth in the appended claims. However, for purpose of explanation, several embodiments of the invention are set forth in the following figures.

FIG. 9 summarizes the actions that are taken to perform multiplication based on the value of the current three bits of the multiplier using a modified Booth algorithm.

DETAILED DESCRIPTION OF THE INVENTION

Figure 1:
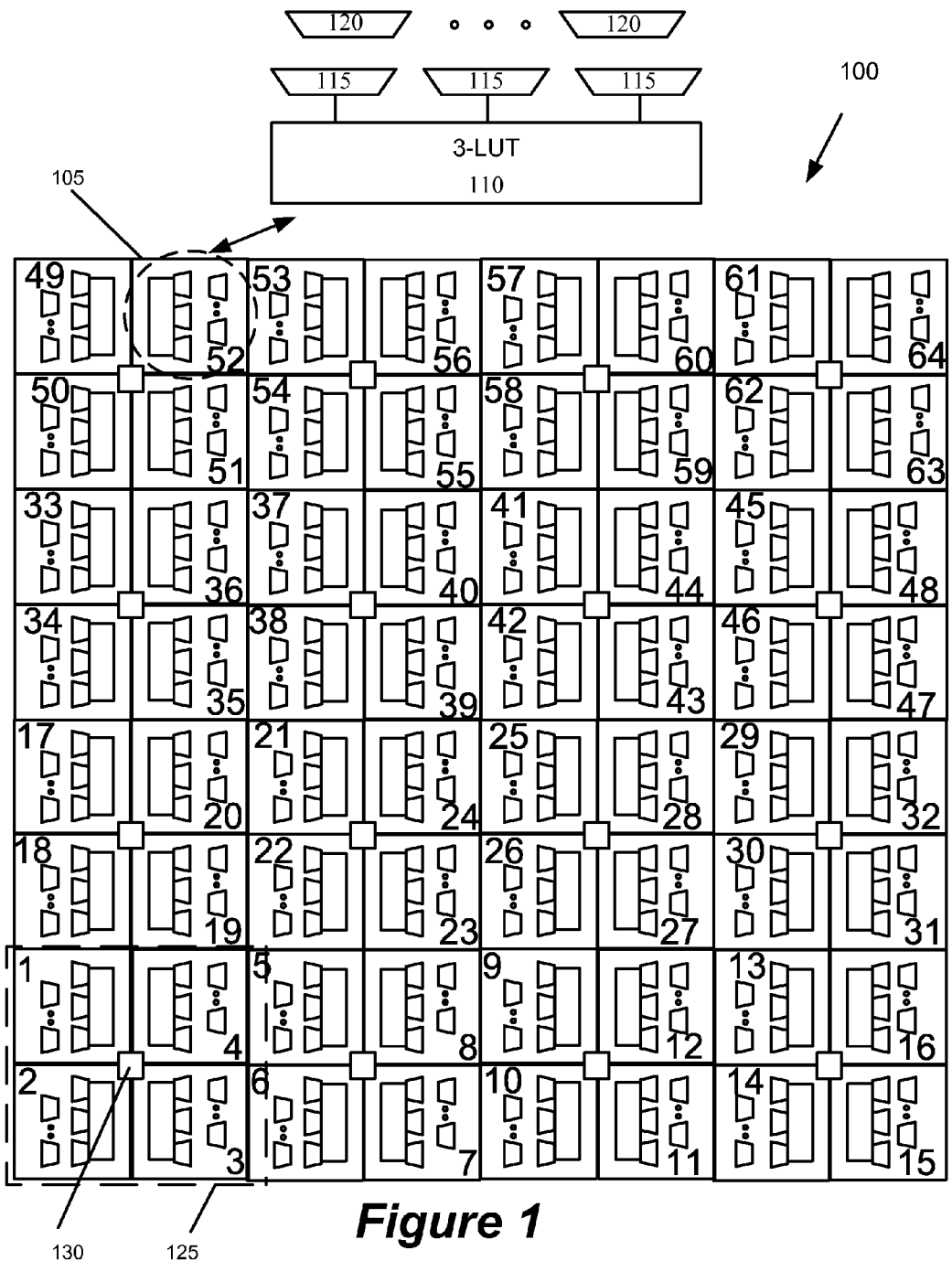
FIG. 1 illustrates a configurable IC of some embodiments in which each four tiles share one carry logic circuit.

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

I. Overview

Some embodiments provide a reconfigurable IC with at least one reconfigurable circuit that conditionally transitions through configuration data sets. In some embodiments, the reconfigurable circuit transitions through configuration data sets based on a user-design signal. In some embodiments, at least one reconfigurable circuit conditionally performs different operations on the same set of inputs.

Some embodiments provide a method of operating a configurable circuit of an integrated circuit (IC). The method performs a first operation by the configurable circuit based on a first configuration data set. The method generates a user-design signal within the IC. When the user-design signal has a value from a set of values, the method performs a second operation by the configurable circuit based on a second configuration data set, after the first operation. When the user-design signal does not have a value from said set of values, the method performs a third operation by the configurable circuit based on a third configuration data set, after the first operation. In some embodiments, the first, second, and third configuration data sets are supplied to the configurable circuit by a selection circuit that receives a selection signal based on the user-design signal. In some embodiments, the selection signal is generated by a signal generator that receives the user-design signal and generates the selection signal based on the user-design signal. In some embodiments, the user-design signal is a non-repetitive, non-clock signal.

Some embodiments provide a reconfigurable integrated circuit (IC) that includes a set of reconfigurable circuits and sets of configuration storage elements. Each set of configuration storage elements is associated with one reconfigurable circuit. Each set of configuration storage elements stores several configuration data sets. Each configuration data set defines a set of operations that a reconfigurable circuit performs. At least one reconfigurable circuit receives a first subset of its configuration data when a user-design signal has a first value and receives a second sub-set of its configuration data when the user-design signal has a second value. In some embodiments, the reconfigurable IC also includes a set of selection circuits. Each selection circuit can supply several configuration data sets from the configuration storage elements to each reconfigurable circuit. At least one selection circuit conditionally supplies configuration data sets to the at least one reconfigurable circuit based on the user-design signal.

Some embodiments provide a method of performing a mathematical operation on a set of operands. The mathematical operation includes several sub-operations. The method examines several bits of at least one operand at a time and depending on the value of these bits, reconfigures a single logic circuit to perform one of the sub-operations to generate a partial result of the mathematical operation. In some embodiments, the logic circuit is reconfigured by receiving a first set of configuration data that cause the logic circuit to reconfigure to perform a first sub-operation operation and a second set of configuration data that cause the logic circuit to reconfigure to perform a second sub-operation. In some embodiments, the logic circuit receives different inputs based on the value of the bits being examined. In some embodiments, the mathematical operation is multiplication and the sub-operations are addition and subtraction.

Some embodiments provide a reconfigurable integrated circuit ("IC") that can perform multiplication. The IC includes a first reconfigurable logic circuit and a signal generator that can generate a selection signal based on a value of a particular number of bits of a multiplier. The IC also includes a first selection circuit that ca supply several configuration data sets for the first reconfigurable circuit based on the selection signal. The reconfigurable logic circuit is reconfigured to perform either an addition operation or a subtraction operation to generate a partial result of the multiplication. In some embodiments, the IC also includes a second reconfigurable circuit that can supply several inputs to the first configurable circuits and a second selection circuit that can supply several configuration data sets for the second reconfigurable circuit based on the selection signal. Based on the selection signal, the second reconfigurable circuit supplies either a value of a multiplicand, twice the value of the multiplicand, or a value of 0 as input to the first reconfigurable circuit.

Some embodiments provide a method of performing circuit synthesis that receives a design that has a function with several inputs. The method identifies a set of early arriving inputs of the function and performs Shannon decomposition on the function based on one of the early arriving inputs. In some embodiments, the method estimates the number of circuits a signal has to travel through to reach each input of the function and selects a set of inputs with signals that travel through fewer numbers of circuits compared to signals of inputs that are not selected. In some embodiments in which the design has more than a particular number of inputs, the method recursively identifies early arriving signals and performs Shannon decomposition on the resulting functions until Shannon decomposition results in a set of functions all of which with fewer than a particular number of inputs.

Some embodiments provide a computer readable medium that stores a computer program that can perform circuit synthesis. The computer program is executable by at least one processor. The computer program includes sets of instructions for receiving a design comprising a function with a plurality of inputs, for identifying a set of early arriving inputs of the function, and for performing a function decomposition on the function based on one of the early arriving inputs.

Several more detailed embodiments of the invention are described in sections below. Before describing these embodiments further, an overview of the configurable IC architecture that is used by some of these embodiments is first described below in Section II. This discussion is followed by the discussion in Section III of reconfigurable circuits that loop through less than the maximum number of available configuration data sets. Next, Section IV describes time multiplexers and discusses how portions of the IC in some embodiments go through sub-cycle configuration conditionally. Next, Section V describes the use of time multiplexers and function decomposition in automatic circuit design. Next, Section VI describes the space-time context generator of some embodiments that generates sub-cycle signals to drive a reconfigurable circuit to go through the states in a loop. Last, Section VII describes a configurable IC and an electronics system that has an IC which implements some of the embodiments of the invention.

II. Architecture

Some embodiments are implemented in a reconfigurable IC. A reconfigurable IC is a form of a configurable IC. A configurable circuit is a circuit that can "configurably" perform a set of operations. Specifically, a configurable circuit receives "configuration data" that specifies the operation that the configurable circuit has to perform from the set of operations that it can perform. In some embodiments, the configuration data is generated outside of the configurable IC. In these embodiments, a set of software tools typically converts a high-level IC design description (e.g., a circuit representation or a hardware description language design) into a set of configuration data that can configure the configurable IC (or more accurately, the configurable circuits of the configurable IC) to implement the IC design.

A reconfigurable IC is a configurable IC that has at least one circuit that reconfigures during runtime. In other words, a reconfigurable IC is an IC that has reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it receives a different set of configuration data. Some embodiments of the invention are implemented in reconfigurable ICs that are sub-cycle reconfigurable (i.e., can reconfigure circuits on a sub-cycle basis). In some embodiments, a reconfigurable IC has a large number of logic and interconnect circuits (e.g., hundreds, thousands, etc. of such circuits). Some or all of these circuits can be reconfigurable.

In some embodiments, runtime reconfigurability means reconfiguring without resetting the reconfigurable IC. Resetting a reconfigurable IC entails in some cases resetting the values stored in the state elements of the IC, where state elements are elements like latches, registers, and non-configuration memories (e.g., memories that store the user signals as opposed to the memories that store the configuration data of the configurable circuits). In some embodiments, runtime reconfigurability means reconfiguring after the reconfigurable IC has started processing of the user data. Also, in some embodiments, runtime reconfigurability means reconfiguring after the reconfigurable IC has powered up. These definitions of runtime reconfigurability are not mutually exclusive. Examples of configurable and reconfigurable ICs are described in detail in U.S. patent application Ser. No. 11/081,859, "Configurable IC with Interconnect Circuits that also Perform Storage Operations", filed on Mar. 15, 2005, now U.S. Pat. No. 7,342,415.

FIG. 1 conceptually illustrates a portion 100 of the configurable circuit architecture of some embodiments of the invention. As shown in FIG. 1, this architecture is formed by numerous conceptual configurable tiles 105 that are arranged in an array with multiple rows and columns. In FIG. 1, each configurable tile is a conceptual grouping of a configurable three-input logic circuit 110, three configurable input-select interconnect circuits 115, and several configurable routing interconnect circuits 120. Different embodiments have different number of configurable routing interconnect circuits 120. For instance, some embodiments may have eight configurable routing interconnect circuits while others may have more or less such circuits. For each configurable circuit, the configurable IC includes a set of storage elements (not shown) for storing a set of configuration data.

In some embodiments, the logic circuits are look-up tables (LUTs) while the interconnect circuits are multiplexers. Also, in some embodiments, the LUTs and the multiplexers are sub-cycle reconfigurable circuits, as described in U.S. patent application "Configurable IC with Routing Circuits with Offset Connections", Ser. No. 11/082,193, filed on Mar. 15, 2005, now U.S. Pat. No. 7,295,037. In some of these embodiments, the configurable IC stores multiple sets of configuration data for a sub-cycle reconfigurable circuit, so that the reconfigurable circuit can use a different set of configuration data in different sub-cycles. Other configurable tiles can include other types of circuits, such as memory arrays instead of logic circuits.

In FIG. 1, an input-select multiplexer 115, also referred to as IMUX, is an interconnect circuit associated with the LUT 110 that is in the same tile as the input select multiplexer. One such input select multiplexer receives input signals for its associated LUT and passes one of these input signals to its associated LUT.

In FIG. 1, a routing multiplexer (also referred to as an RMUX) 120 is an interconnect circuit that at a macro level connects other logic and/or interconnect circuits. In other words, unlike an input select multiplexer that only provides its output to a single logic circuit (i.e., that only has a fan out of 1) in some embodiments, a routing multiplexer either provides its output to several logic and/or interconnect circuits (i.e., has a fan out greater than 1), or provides its output to other interconnect circuits.

In some embodiments, an RMUX is a complementary pass logic (CPL) implemented 8-to-1 multiplexer. In some of these embodiments, an RMUX may have a latch built in its output stage. In a CPL implementation of a circuit, a complementary pair of signals represents each logic signal. In other words, the circuit receives true and complement sets of input signals and provides true and complement sets of output signals. To implement the latch function of an RMUX, the two (true and complement) outputs of the 8-to-1 multiplexer can be cross coupled with two NMOS transistors that receive a latch enable signal at their gates. This implementation of an RMUX is further described in the above mentioned U.S. patent application Ser. No. 11/081,859.

In the architecture illustrated in FIG. 1, each tile includes one three-input LUT, three input select multiplexer and several routing multiplexers. In addition, every four tiles 125 share a carry logic circuit 130. In the examples used in this application, the term 4-aligned LUT tile refers to four tiles (each with one LUT) with a common carry logic circuit.

In the embodiments described below, one, two, or three of the IMUXs are hybrid multiplexers, called HMUXs. An HMUX is a multiplexer that can receive "user-design signals" or configuration data. A user-design signal within a configurable IC is a signal that is generated by a circuit (e.g., logic circuit) of the configurable IC. The word "user" in the term "user-design signal" connotes that the signal is a signal that the configurable IC generates for a particular application that a particular user has configured the IC for. User-design signal is abbreviated to user signal in some of the discussions below.

In some embodiments, a user signal is a signal that is generated within the configurable IC. In some embodiments, a user signal is a signal that is a function of at least a portion of the configuration data received by the configurable IC and at least a portion of the inputs to the configurable IC. In these embodiments, the user signal can also be dependent on (i.e., can also be a function of) the state of the configurable IC. The initial state of a configurable IC is a function of the configuration data received by the configurable IC and the inputs to the configurable IC. Subsequent states of the configurable IC are functions of the configuration data received by the configurable IC, the inputs to the configurable IC, and the prior states of the configurable IC.

When implementing a particular user design, a configurable IC performs user-design operations that allow the IC to implement the particular user design in a circuit or device. During such user-design operations, the configurable IC (1) can receive user-design input data, which are neither configuration signals nor clocking signals, and (2) can process these signals to implement the particular user design in a circuit or device. Accordingly, in some cases, a configurable IC performs user-design operations when it receives and processes user-design input data and provides user design output data. For instance, when the configurable IC performs user-design operations, its configurable logic circuits in some cases can receive user-design input data, compute functions based on the user-design input data, and output their results to other circuits inside the IC. In other contexts, a configurable IC might implement a user design that simply directs the IC to generate output without receiving any user-design input.

When a configurable IC performs user-design operations, its circuits typically receive clocking signals that allow them to process user-design signals. Examples of such clocking signals include (1) clocking signals applied to input/output buffer circuits that allow these circuits to receive and output user-design data, (2) clocking signals applied to the configurable logic circuits that allow these circuits to compute user-design functions, and/or (3) clocking signals applied to the IC's configurable interconnect circuits that allow these circuits to perform user-design connection operations. In case of a reconfigurable IC that has reconfigurable circuits that receive different configuration data sets loaded on the IC, the clock signals can also include clock signals that allow the reconfigurable circuit to step through the different configuration data sets.

A person of ordinary skill in the art will recognize that other architectures are possible and the invention can be embodied in other specific forms without departing from the spirit of the invention. For instance, some embodiments have different logic circuits, interconnect circuits, etc.; different number of these circuits; different arrangement of these circuits; or different number of inputs and outputs for these circuits.

III. Reconfigurable Circuits that Loop Through Less than the Maximum Number of Available Configuration Data Sets A. Configuration Data Sets and "Looperedness"

Figure 2:
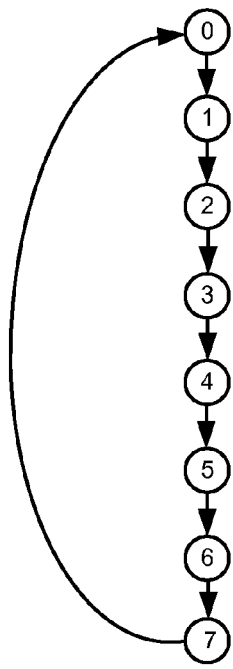
FIG. 2 illustrates several configuration data sets received by a reconfigurable circuit in a loop.

In some embodiments, a reconfigurable circuit receives configuration data sets sequentially in an order that loops from the last configuration data set to the first configuration data set. FIG. 2 illustrates eight configuration data sets received by a reconfigurable circuit according to such a looping sequence that can loop through configuration data sets. In this figure, the arrows illustrate how the configuration data sets follow each other. Such a sequential reconfiguration scheme is hereinafter referred to as a "loopered" scheme. For instance, FIG. 2 illustrates an 8-loopered scheme for providing the configuration data sets to a reconfigurable circuit. The full cycle of the reconfigurable circuit is, therefore, divided into eight sub-cycles.

In FIG. 2, each one of the eight configuration data sets (0-7) provides a space-time context (or configuration state) for the reconfigurable circuit. Each space-time context is defined by a set of bits. The space-time context for a reconfigurable circuit in a particular clock cycle or sub-cycle is the configuration data sets that the circuit receives during the cycle. Each set (or word) of configuration data is termed as context as it defines the operation (i.e., the logic or interconnect operation) that a particular reconfigurable circuit (i.e., a logic circuit or an interconnect circuit) performs for a particular cycle out of the rest of operations that the circuit can perform. During a cycle, space-time context for the IC is all the configuration data sets that all the reconfigurable circuits receive during that cycle.

Figure 3:
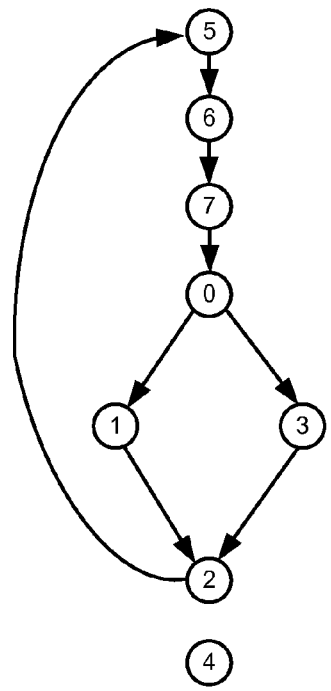
FIG. 3 illustrates an example of a reconfigurable circuit that conditionally transitions through configuration data sets.

In some embodiments, however, a reconfigurable circuit does not receive all configuration data sets in each loop. This is the case when, e.g., due to timing constraints, a portion of the user design does not require all configuration data sets to run. The unused configuration data sets can be utilized to conditionally perform different operations. For instance, if there are n configuration data sets, a reconfigurable circuit may conditionally cycle through m (where m is smaller than n) configuration states in each loop based on a certain condition. FIG. 3 illustrates one such example. Specifically, it illustrates eight configuration data sets that are available for a particular reconfigurable circuit.

As shown, after configuration data set 0, the circuit receives either configuration data set 1 or configuration data set 3. Specifically, as long as a certain condition (such as presence of a certain signal) is true, then the reconfigurable circuit receives configuration data sets 0, 1, 2, 5, 6, and 7 in a loop. Once the condition becomes false, the circuit receives configuration data sets 0, 3, 2, 5, 6, and 7 in a loop. As shown, configuration data set 4 is not used for the particular reconfigurable circuit and the particular user design shown in FIG. 3. A full cycle of the reconfigurable circuit that receives the configuration data sets shown in FIG. 3 is, therefore, divided into 6 sub-cycles. In some embodiments, a user-design signal determines the condition upon which the reconfigurable circuit receives a particular configuration data set.

Figure 4:
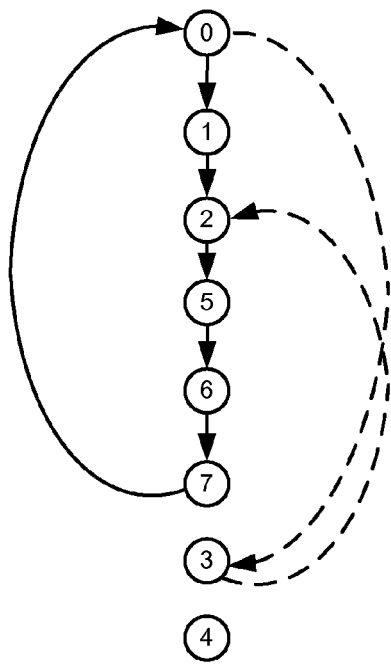
FIG. 4 another example of a reconfigurable circuit that conditionally transitions through configuration data sets.

Similarly, FIG. 4 illustrates eight configuration data sets 0-7. Based on a certain condition, the reconfigurable circuit receives either configuration data sets 0, 1, 2, 5, 6, and 7 or configuration data sets 0, 3, 2, 5, 6, and 7. As shown, configuration data set 4 is not used for the particular reconfigurable circuit and the particular user design shown in FIG. 4. A full cycle of the reconfigurable circuit that receives the configuration data sets shown in FIG. 4 is, therefore, divided into 6 sub-cycles.

Figure 5:
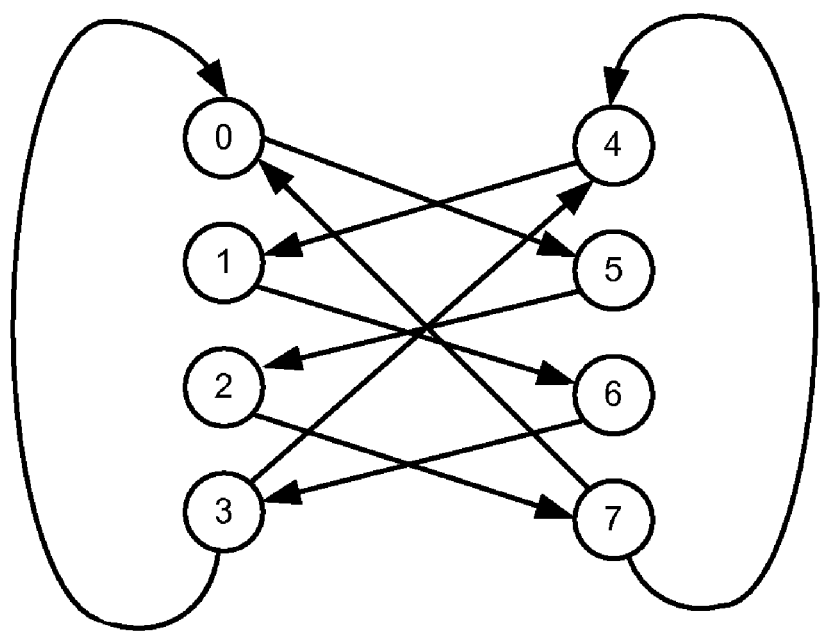
FIG. 5 another example of a reconfigurable circuit that conditionally transitions through configuration data sets.

FIG. 5 illustrates another possible way of conditionally going through eight possible configuration data sets. The reconfigurable circuit receives either configuration data sets 0, 5, 2, 7 or 4, 1, 6, 3. As shown, after receiving configuration data set 7, the reconfigurable circuit may receive configuration data set 4 instead of configuration data set 0. Similarly, after receiving configuration data set 3, the reconfigurable circuit may receive configuration data set 0 instead of configuration data set 4.

In each of the cases illustrated in FIGS. 3-5, the decision to which configuration data set the circuit receives depends on the value of a user signal (not shown). For instance, as will be described below, in FIG. 3 a particular user signal with a value of 0 may cause the reconfigurable circuit to receive configuration data set 1 after configuration data set 0. The configuration data set 1 may, for instance, reconfigure the circuit to perform an add operation. On the other hand, a value of 1 for that user signal may cause the reconfigurable circuit to receive configuration data set 3 after configuration data set 0 and reconfigure to perform a subtraction operation.

B. Time Multiplexers

Time multiplexer (TMUX) conceptually refers to configurable circuits conditionally going through their configuration data sets. To facilitate this, some embodiments use space-time context generators (ST-context generators) which generate sub-cycle signals that control the operations of the circuitry that provides configuration data sets to the configurable circuits. In generating such sub-cycle signals, ST-context generators (also referred to as sub-cycle signal generators) of some embodiments receive user signals which cause them to modify the signals it generates for different configurable circuits. In other words, these users design signals cause the configurable circuits to conditionally transition through their configuration data sets by having the ST-context generator to modify its output which in turn modify the configuration data fetching circuitry associated with the configuration circuits.

Figure 6:
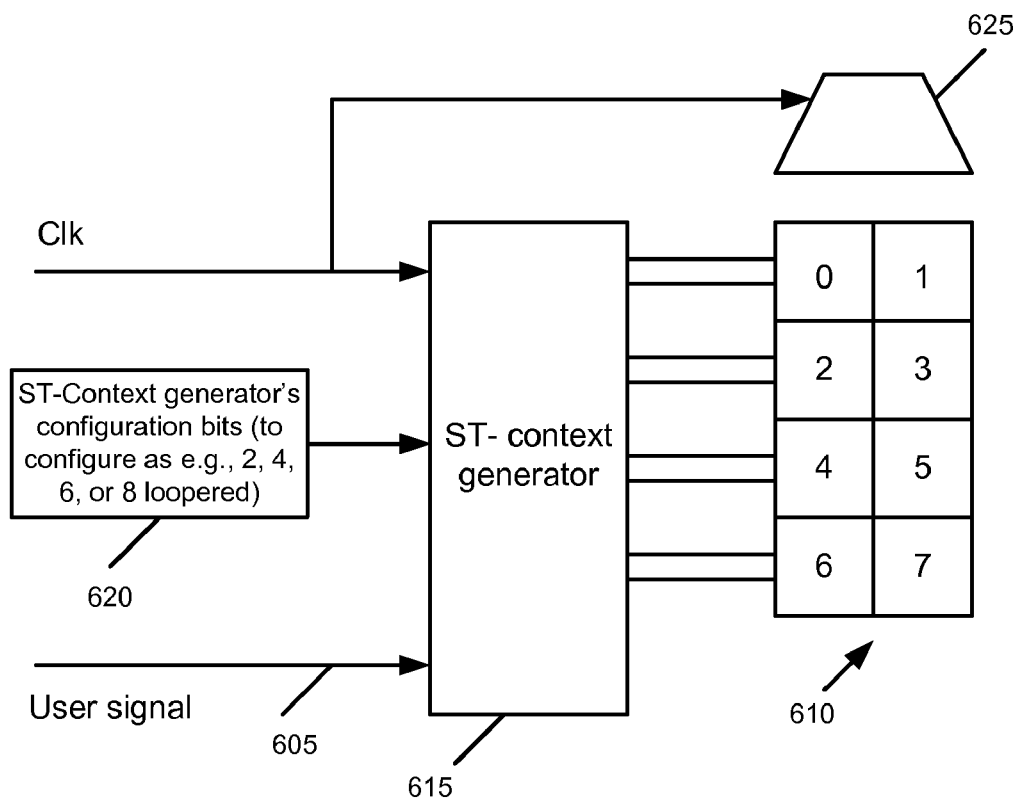
FIG. 6 conceptually illustrates a time multiplexer in some embodiments.

A TMUX provides the ability to make configuration decisions based on user signals. A TMUX is conceptually illustrated in FIG. 6. The ST-context generator 615 operates as a counter that decodes the next row of configuration storage 610. As shown, the ST-context generator receives a set of configuration bits 620 that determine whether the ST-context generator operators, e.g., in any of the 2, 4, 6, or 8 loopered configurations. As shown in FIG. 6, a user signal 605 determines the next row of the configuration storage 610 that is decoded. The configuration storage stores a set of configuration data bits for a configurable circuit. A selection circuit 625 supplies the configuration data sets to a reconfigurable circuit (not shown). ST-context generators and their associated selection circuits are described further below. A TMUX recoups the waste of configuration storage when, due to timing constraints, a user design is not run at the highest loopered-ness (i.e., the user design is not using all configuration data sets in each particular loop).

There are a number of ways this configuration storage can be reused. What differentiates the techniques is whether the user specifies the "decision" to be made by the TMUX, or whether the synthesis tools determine it directly from a user register transfer level (RTL) description of the user design. An example of a user determined decision is two substantial design modules which are mutually exclusive. Which of the two modules is currently relevant is determined by the state of the design. The two modules can be placed on the same region and the TMUX can be used to select between these two contexts based on the design state. In the case of tools doing the determination, the tools can do "Shannon decomposition in time" to determine two mutually exclusive configuration of a logic circuit based on previously known logic values.

IV. Going Through Sub-Cycle Configuration Conditionally

When there are more configuration sets than the sub-cycles needed for a part of the design to operate, the extra configuration data set(s) can be utilized to conditionally perform different operations in that particular part of the design. Several examples are given in the following sub-sections.

A. Conditional Add or Subtract

Figure 7:
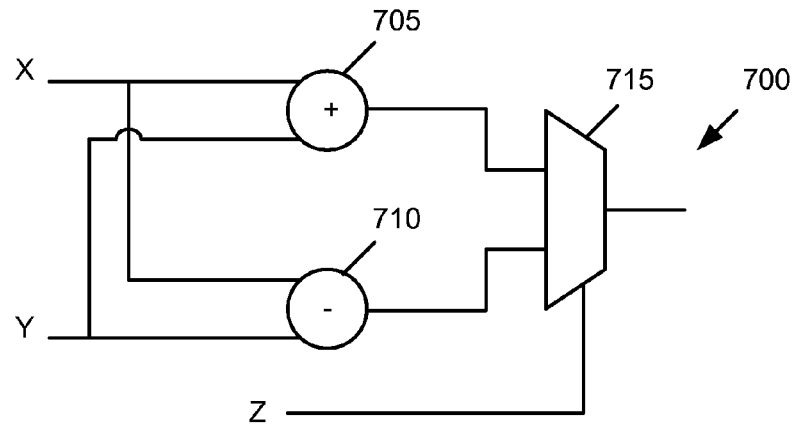
FIG. 7 illustrates a prior art circuit that conditionally performs either an add operation or a subtract operation.

FIG. 7 illustrates a prior art circuit 700 that conditionally performs either an add operation or a subtract operation. The two inputs, X and Y, are fed to the adder 705 and the subtractor 710. The outputs of the adder 705 and the subtractor 710 are connected to the inputs of the 2-to-1 multiplexer 715. A signal, Z, that is connected to select line of multiplexer 715 determines the results of which of the two operations is output from the multiplexer.

Figure 8A:
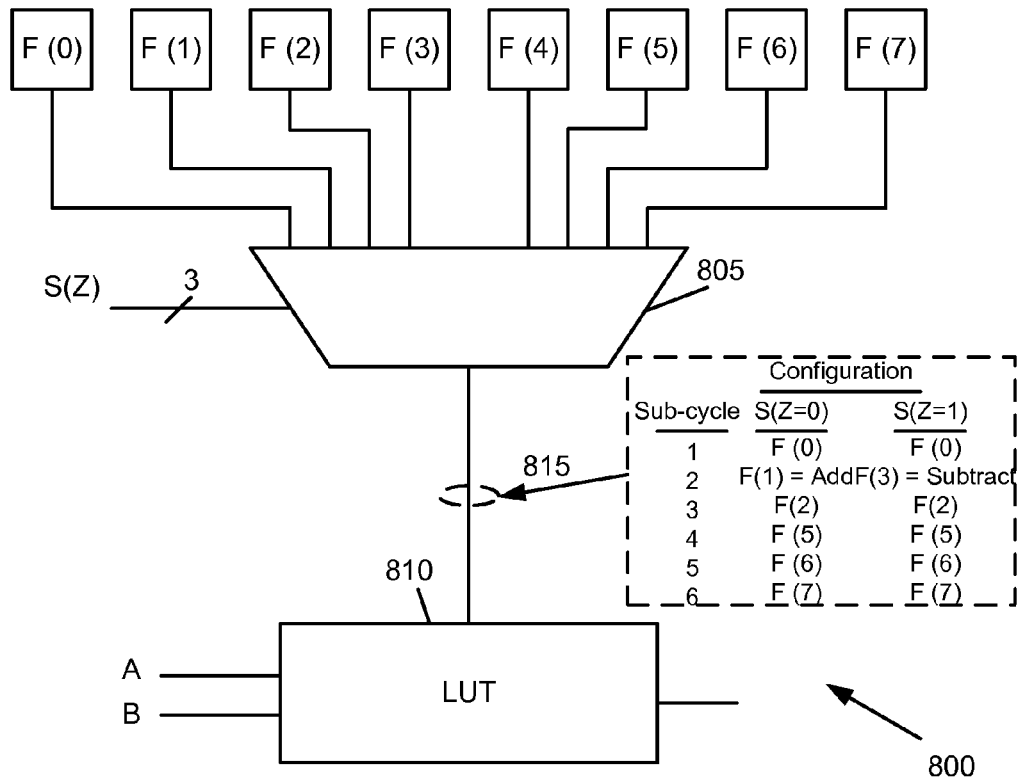
FIG. 8A conceptually illustrates a circuit that conditionally performs either an add operation or a subtract operation in some embodiments.

FIG. 8A conceptually illustrates a circuit 800 that conditionally performs an add operation or a subtract operation in some embodiments. The 8-to-1 multiplexer receives eight sets of configuration data, F(0) to F(7), at its inputs. Each set of configuration data, F(0) to F(7) is a multi-bit value. Based on the value of the multi-bit select signal S, the multiplexer connects one of its inputs to its output. The signal S is dependent on the value of a user signal, Z. As shown, the output of the multiplexer 805 is connected to the input of the look-up table (LUT) 810. LUT 810 is a reconfigurable circuit. In each sub-cycle, the configuration data set 815 that the LUT receives determines the operation that the LUT performs during that sub-cycle.

Figure 8B:
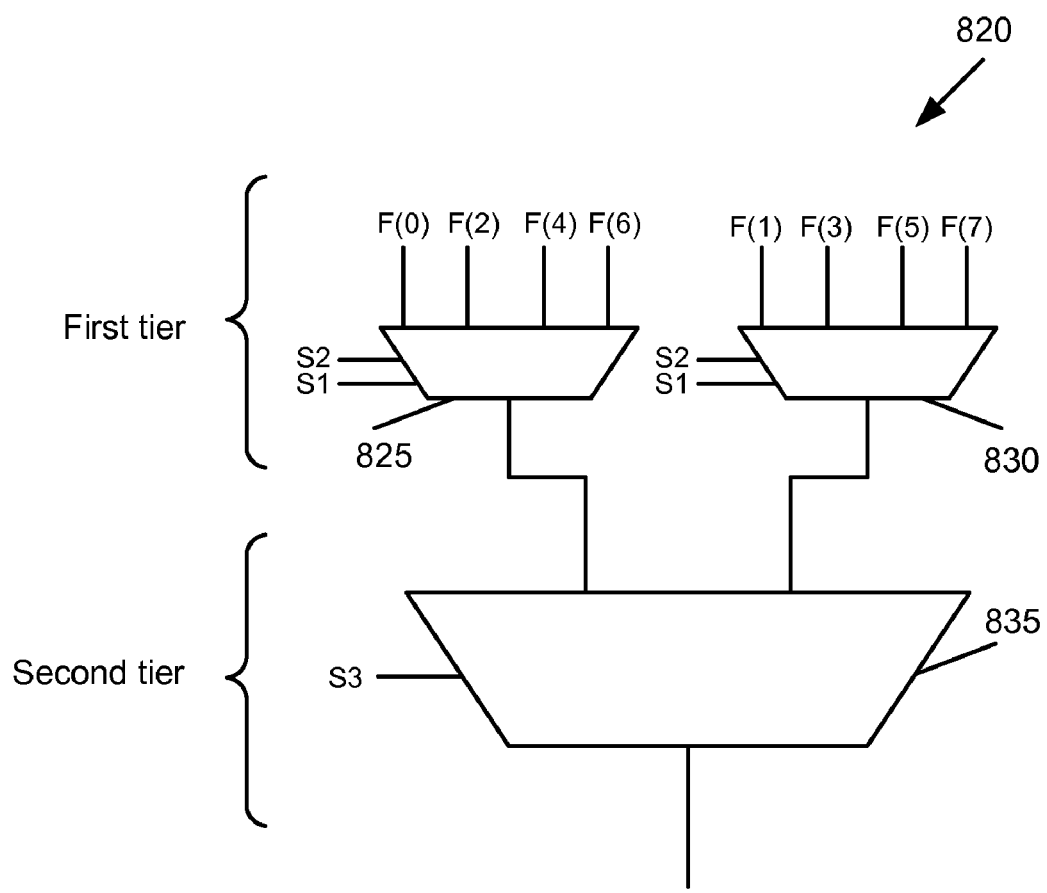
FIG. 8B conceptually illustrates a multi-tier multiplexer of some embodiments that is utilized to supply configuration data to a configurable circuit.

In some embodiments, the 8-to-1 multiplexer is implemented as a two-tiered multiplexer. FIG. 8B conceptually illustrates such a two-tiered multiplexer 820. As shown, the first tier has two 4-to-1 multiplexers 825 and 830, and the second tier has one 2-to-1 multiplexer 835. The multiplexers in the first tier receive configuration data as their inputs. Specifically, multiplexer 825 receives F(0), F(2), F(4), and F(6) while multiplexer 830 receives F(1), F(3), F(5), and F(7) at their inputs. Two bits (S1 and S2) of the select signal S control the multiplexers of the first tier and one bit (S3) controls the multiplexer of the second tier. Depending on the value of the three bits of the select signal S (which are in turn dependent on the value of a user signal such as Z shown in FIG. 8A), one of the configuration bits F(0) to F(7) is selected to connect to the output of the two-tiered multiplexer 820.

Some embodiments that use this two-tiered structure, build the first tier of multiplexers into the sensing circuitry of the configuration storage. Examples of this structure are described in the above mentioned U.S. application Ser. No. 11/081,859.

As shown in FIG. 8A, when the user signal Z is 0, the 3-bit select signal S of the multiplexer 805 selects configuration data sets F(0), F(1), F(2), F(5), F(6), and F(7). When the user signal is 1, the select signal S of the multiplexer selects configuration data sets F(0), F(3), F (2), F(5), F(6), and F(7). The LUT is designed to perform an add operation if it receives configuration data set F(1) and to perform a subtract operation if it receives configuration data set F(2). The LUT, therefore, conditionally performs either an add or a subtract operation based on the value of the user signal, Z.

Circuit 800 performs a similar operation as circuit 700. While circuit 700 requires an adder (705), a subtractor (710), and a multiplexer (715), circuit 800 only needs a LUT and its associated configuration multiplexer 805. Circuit 800, therefore, saves on the logic circuitry and routing resources.

B. Use of TMUX to Perform Complex Operations

The following example shows how a modified Booth recoding scheme is implemented using the time-space context generator in some embodiments to perform multiplication. In a Booth multiplier, two bits of the multiplier are considered at a time and a partial product (which is initially set to 0) is updated based on the value of the current two bits of the multiplier. The Booth algorithm works on the following equality (A):

$$2^J + 2^{J-1} + 2^{J-2} + \ldots + 2^K = 2^{J+1} + 2^K \qquad (A)$$

The Booth algorithm exploits the equality, (A), to create faster multipliers by replacing a sequence of n 1s in the multiplier (that requires n additions), by one addition and one subtraction. The Booth algorithm doesn't perform well when the multiplier has a singleton 1 (i.e., a 1 separated by 0s) which would replace one addition by one addition and one subtraction. The modified Booth algorithm is an improvement of the Booth algorithm.

In a modified Booth algorithm, three bits of the multiplier are considered at a time. Table 900 in FIG. 9 summarizes the actions that are taken by the modified Booth multiplier algorithm to perform multiplication based on the value of the current three bits of the multiplier.

The modified Booth multiplier algorithm ignores runs of 0 or 1 in the multiplier. Therefore, as shown in Table 900, when the three bits of the multiplier are 000 or 111, no action is required. A singleton 1 (010) requires the multiplicand to be added to the partial result. A single 1 at the end of a run of 1 (001) and two is at the end of a run of 1 (011) require adding either the multiplicand or two times the multiplicand to be added to the partial result, respectively. A single 1 beginning a run of 1s (001) or two 1s beginning a run of 1s (110) require subtracting two times the multiplicand or the multiplicand from the partial results, respectively. Finally, end of run of 1s and beginning of another (101) requires subtracting the multiplicand from the partial results.

Figure 10:
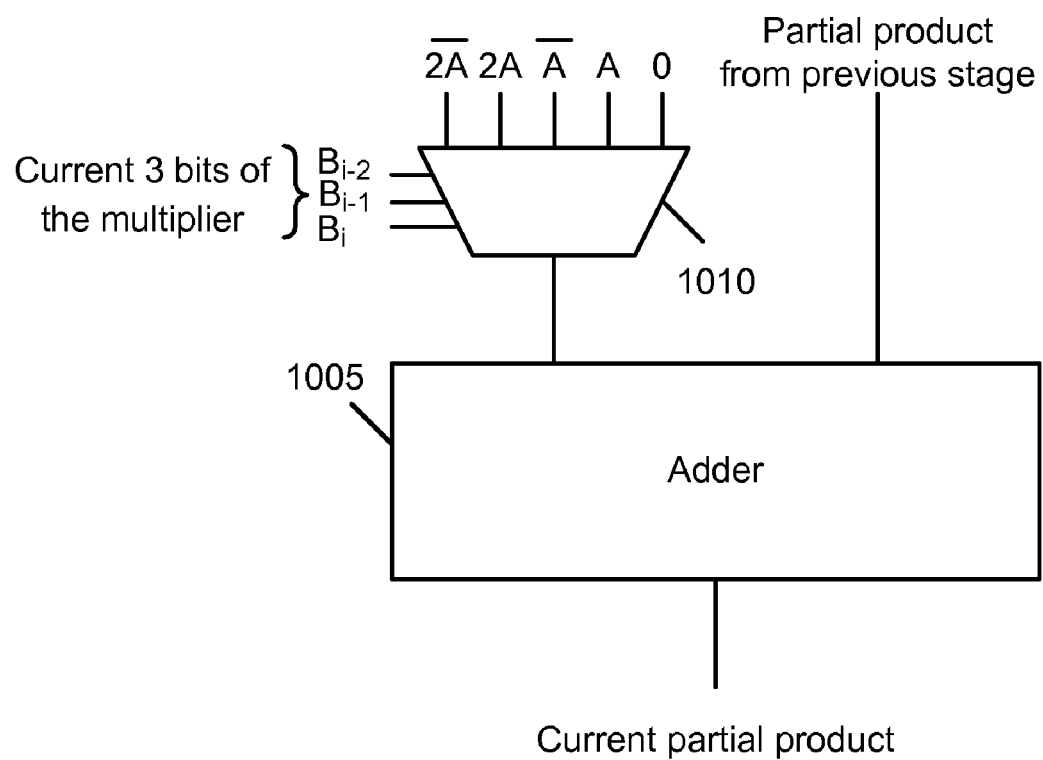
FIG. 10 conceptually illustrates a traditional implementation of a modified Booth multiplier that multiplies a multiplicand A, by a multiplier B.

FIG. 10 conceptually illustrates a traditional implementation of the modified Booth multiplier that multiplies a multiplicand A, by a multiplier B. The partial product is initially set to zero (not shown). The bits of the multiplier are examined three at a time. The current three bits of the multiplier are utilized as the three select lines of multiplexer 1010. The values of the current three bits of the multiplier ($B_i$, $B_{i-1}$, and $B_{i-2}$) determine what value is added to the partial product. Specifically, Table 900 shows the required action for each combination of 000 to 111 of the current three bits of the multiplier.

Figure 11:
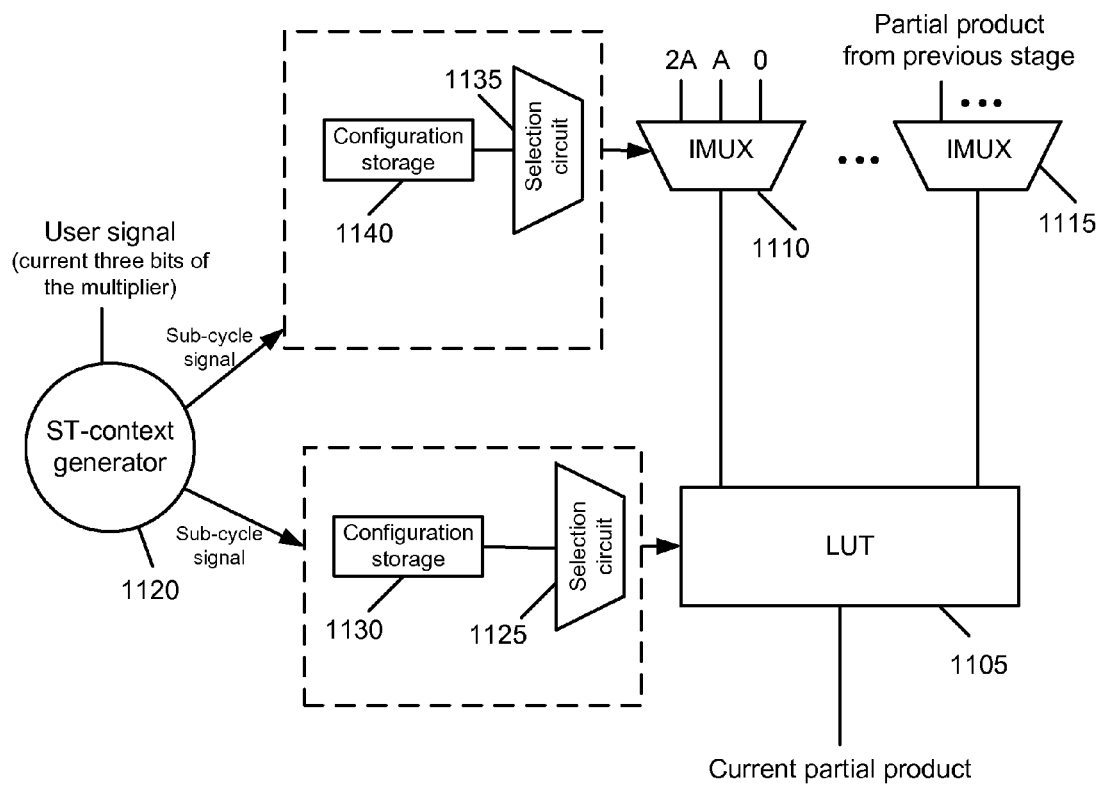
FIG. 11 conceptually illustrates a modified Booth multiplier implemented using time multiplexer in some embodiments.

FIG. 11 conceptually illustrates a Booth multiplier implemented using TMUX. ST-context generator 1120 uses the user signal (which is the current three bits of the multiplier) to generate space-time context for each sub-cycle. The context generator 1120 does not make context generation in a traditional sense, instead it operates as a per sub-cycle multiplier function. Specifically, instead of cycling through as a counter, it uses the three current bits of the multiplier to generate the sub-cycle signal.

LUT 1105 is a reconfigurable circuit and can reconfigure to perform either addition or subtraction. As shown, LUT 1105 has an associated selection circuit 1125 and configuration storage 1130 that receive the sub-cycle signal from the ST-context generator and supply space-time context to the LUT.

IMUXs 1110 and 1115 route inputs to the LUT. As shown, IMUX 1110 has an associated selection circuit 1135 and configuration storage 1140 that receive the sub-cycle signal from the ST-context generator and supply space-time context to the LUT. IMUX 1110 also has an associated selection circuit and configuration storage which are not shown in FIG. 11. Since LUT 1105 is a reconfigurable circuit, instead of adding $\overline{A}$ or $\overline{2A}$ the value of A or 2A is subtracted from the partial product, respectively. This reduces the inputs of the IMUX 1110 by two and saves routing resources.

IMUX 1110 is used to input the next values to add or subtract. IMUX 1115 is used to input the partial product from the previous sub-cycle. In each sub-cycle, depending on the values of the current three bits of the multiplier, ST-context generator 1120 generates an appropriate signal to selection circuit 1125 and configuration storage 1130 which causes them to supply the appropriate configuration data to LUT 1105 to configure the LUT as either an adder or a subtractor. Specifically, LUT 1105 is either configured to act as an adder (when the current three bits of the multiplier are 000, 001, 010, 011, and 111) or as a subtractor (when the bits are 100, 101, or 110).

Similarly, in each sub-cycle, depending on the values of the current three bits of the multiplier, ST-context generator 1120 generates an appropriate signal to selection circuit 1135 and configuration storage 140 which causes them to supply the appropriate configuration data to IMUX 1110. IMUX 1110 is configured to input either 0 (when the current three bits of the multiplier are 000 or 111), A (when the bits are 001 or 010, 101, or 110), or 2A (when the bits are 011 or 100) to LUT 1110. Some embodiments require only the two values of A and 2A (and not the value of 0) to be input to IMUX 1110. In these embodiments, LUT 1105 is configured to leave the partial product unchanged when the three bits of the multiplier are 000 or 111.

Although the above description was given using a Booth multiplier as an example, one of ordinary skill in the art will realize that the same approach can be applied to implement other mathematical operations that conditionally perform several sub-operations based on the value of a portion of at least one of the operands. Specifically, the method described in this section can be applied to examine a portion of one or more of the operands and to use a single logic circuit to conditionally perform one of the several sub-operations to generate a partial result of the mathematical operation.

C. Use of TMUX to Share Routing Resources and Save on Data Paths

The previous examples for performing mathematical operations were examples of utilizing TMUX to perform conditional operations. More complex operations can be performed using TMUX whenever a circuit design includes multiplexers that select between a set of functions, each of which operate on the same set of input. In many cases, using TMUX will result in sharing routing resources and reduction of data paths. For instance, the MD5 encryption operations can be greatly simplified by using TMUX. MD5 encryption operations are a set of AND, OR, and exclusive OR (XOR) operations that are performed on two inputs.

Figure 12:
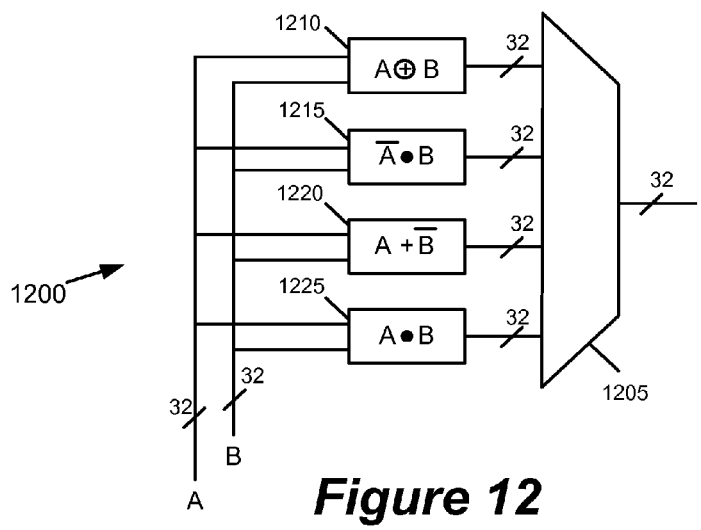
FIG. 12 is a prior art illustration of the operations that are required for performing MD5 encryption.

FIG. 12 conceptually illustrates operations that are required for performing MD5 encryption on a set of two 32-bit values, A and B. The multiplexer 1205 selects one of the outputs of function generators 1210-1225. Function generators 1210-1225 perform $A \oplus B$, $\overline{A} \cdot B$, $A + \overline{B}$, and $A \cdot B$ operations respectively.

As is shown in FIG. 12, implementing a circuit 1200 to perform MD5 encryption requires many routing resources. Specifically, the 32-bit inputs, A and B, have to be routed to function generators 1210-1225 and the 32-bit outputs of these function generators have to be routed to the inputs of multiplexer 1205.

Figure 13:
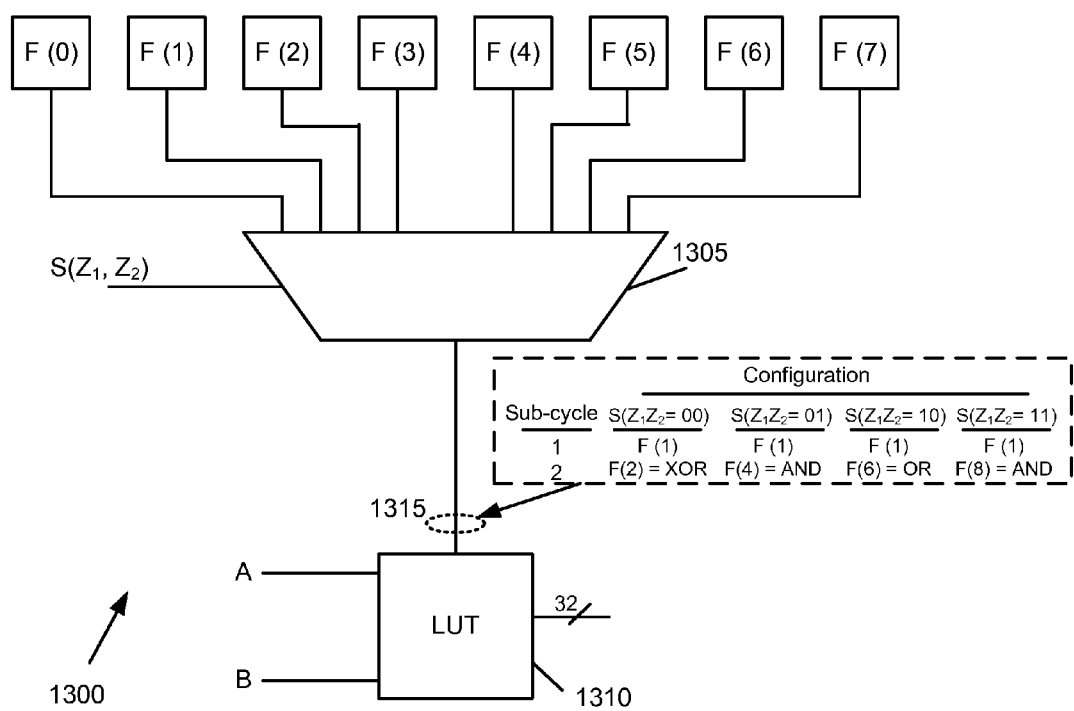
FIG. 13 conceptually illustrates an implementation of MD5 encryption in some embodiments utilizing time multiplexer.

FIG. 13 conceptually illustrates a circuit 1300 that performs MD5 encryptions in some embodiments. The 8-to-1 multiplexer 1305 receives eight sets of configuration data, F(0) to F(7), at its inputs. Based on the value of the select signal S, the multiplexer connects one of its inputs to its output. The signal S is dependent on the values of user signals, $Z_1$ and $Z_2$. As shown, the output of multiplexer 1305 is connected to the input of the look-up table (LUT) 1310. LUT 1310 is a reconfigurable circuit. In each sub-cycle, the configuration data set 1315 that the LUT receives determines the operation that the LUT performs during that sub-cycle.

As shown, when the user signals $Z_1$ and $Z_2$ are 00, the multiplexer selects configuration data sets F(1) and F(2). When the user signals are 01, the multiplexer selects configuration data sets F(1) and F(4). When the user signals are 10, the multiplexer selects configuration data sets F(1) and F(6). Finally, when the user signals are 11, the multiplexer selects configuration data sets F(1) and F(8).

The LUT is designed to perform an XOR operation when it receives configuration data set F(2), to perform AND operation between B and the complement of A when it receives configuration data set F(4), to perform OR operation between A and the complement of B when it receives configuration data sets F(6), and to perform AND operation when it receives configuration data set F(8). The LUT, therefore, conditionally performs the operations that are required for MD5 encryption based on the value of the user signals, $Z_1$ and $Z_2$.

As shown, using circuit 1300 requires that the two 32-bit inputs, A and B to be routed to the inputs of only one logic circuit, i.e., LUT 1310. Therefore, comparing with the prior art arrangement shown in FIG. 12, circuit 1300 saves a large amount of routing resources. In addition, circuit 1300 requires only one function generator (e.g., LUT 1310) as oppose to the four function generators 1210-1225 required in FIG. 12. Therefore, comparing with the prior art, circuit 1300 also saves on the computing resources.

D. Difference Between Using TMUX and Doing Resource Sharing

Figure 14:
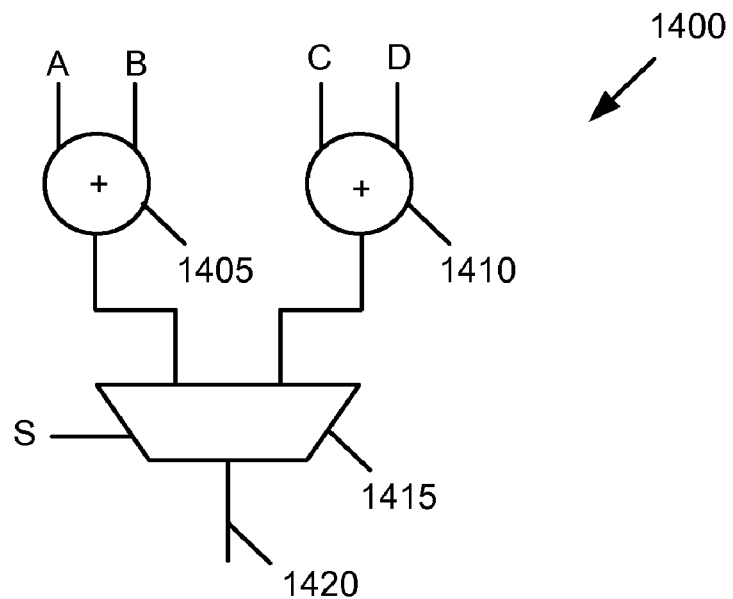
FIG. 14 illustrates a circuit that produces an output in some embodiments.

Resource sharing can be utilized when the same (or similar) operation is performed by the same logic circuit on different sets of input for generating mutually exclusive output results (i.e., results that are not needed at the same time). Note that at least one input should be different in each set to make resource sharing meaningful. FIG. 14 illustrates a circuit 1400 that conditionally performs an add operation on either of two sets of inputs (A and B or C and D) and produces an output 1420. The inputs to multiplexer 1415 are the outputs of adder 1405 (i.e., A+B) and the output of adder 1410 (C+D). Depending on the value of the select signal, S, multiplexer 1415 selects the output of either adder 1405 or 1410 to connect to the output 1420. Therefore, circuit 1400 performs the same operation (i.e., addition) on different sets of inputs (either A and B or C and D) to produce mutually exclusive results (multiplexer 1415 only allows the output of one of the adders 1405 and 1410 to appear at the output 1420).

Figure 15:
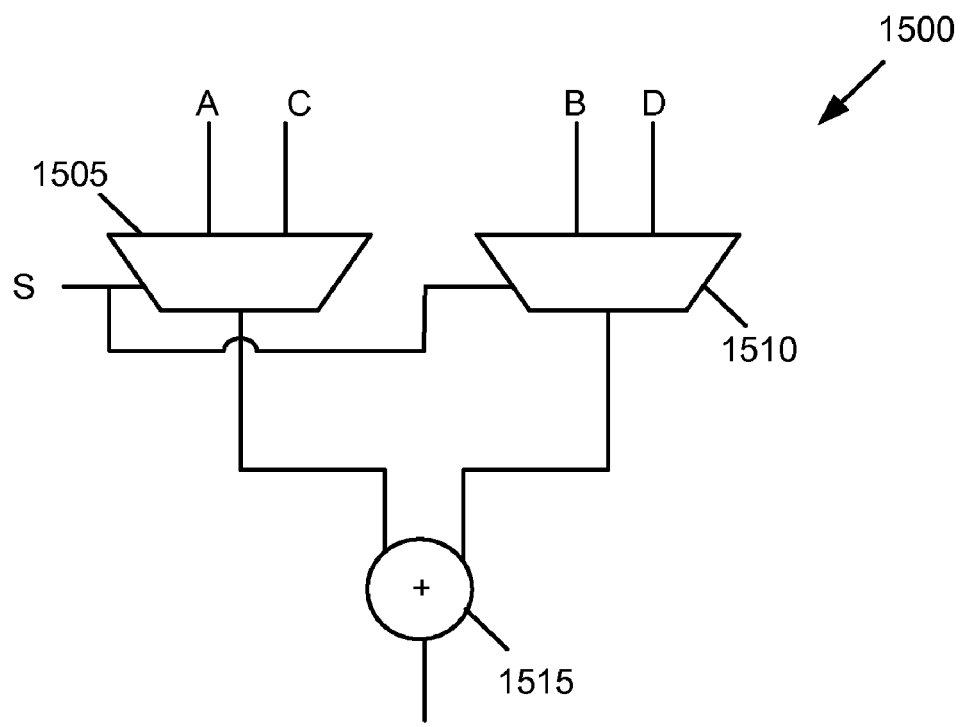
FIG. 15 illustrates a circuit that implements an equivalent functionality as the circuit of FIG. 14 by using resource sharing.

The output of circuit 1400 can be generated using resource sharing. FIG. 15 illustrates a circuit 1500 that has an adder 1515 and two multiplexers 1505 and 1510. The two multiplexers have the same select signal, S. Depending on the value of S, either 1505 selects A and 1510 selects B or 1505 selects C and 1510 selects D. The input to the adder are, therefore, either A and B or C and D. The output 1520 of the circuit 1500 is either A+B or C+D. Circuit 1500 implements the same functionality as circuit 1400 by sharing the adder resource to generate two mutually exclusive results. Note that if the logic circuit (in this case adder 1515) can perform other similar operations, such as subtraction, resource sharing can be utilized to perform similar operations. There is, however, the limitation that the operations have to be performed by the same logic unit that is being shared and the outputs should not be needed at the same time.

Utilizing TMUX is a more generalized way of utilizing the resources. The only requirement to use TMUX is to have functions that operate conditionally to produce mutually exclusive outputs. In other words, using TMUX does not require the operations to be performed by the same logic unit nor the input sets need to be necessarily different.

Figure 16:
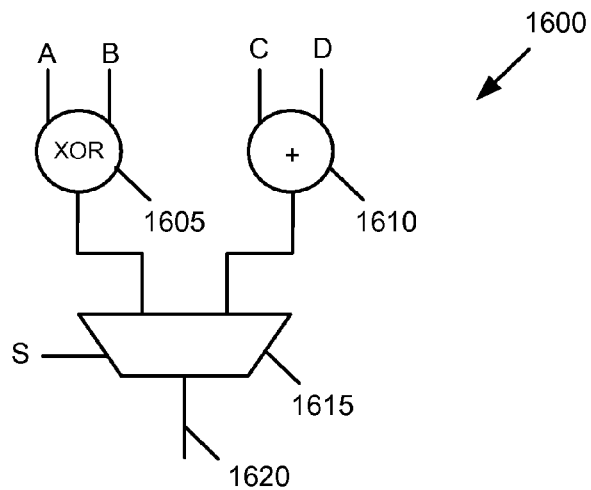
FIG. 16 illustrates a circuit that produces an output in some embodiments.

As an example, FIG. 16 illustrates a circuit 1600 that produces an output 1620. The inputs to multiplexer 1615 are the outputs of the logic circuit 1605 (i.e., A XOR B) and the output of the logic circuit 1610 (C+D). Depending on the value of the select signal, S, multiplexer 1615 selects the output of either the logic circuit 1605 or 1610 to connect to the output 1620. Since the two logic circuits 1605 and 1610 perform different operations (i.e., XOR and addition), resource sharing technique shown in FIG. 15 cannot be used to implement an equivalent for circuit 1600. An equivalent of circuit 1600, however, can be implemented using TMUX.

Figure 17:
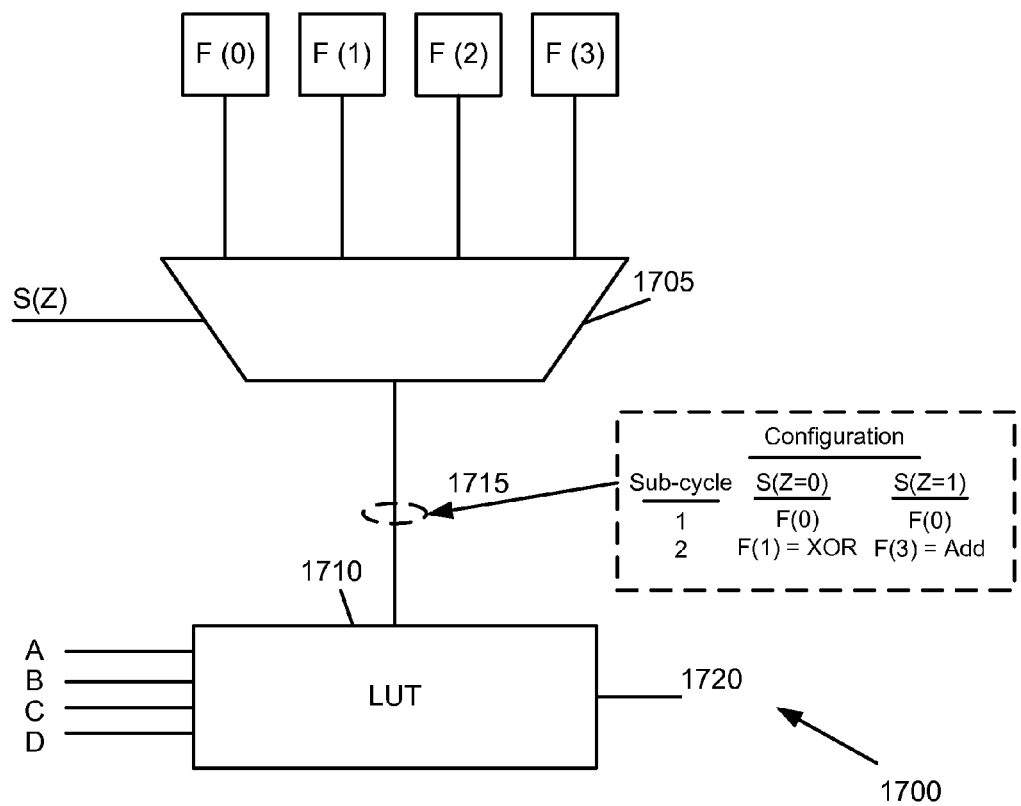
FIG. 17 illustrates a circuit that implements an equivalent functionality as the circuit in FIG. 16 by using time multiplexer.

FIG. 17 illustrates a circuit 1700 that conditionally performs either an add operation or an XOR operation and produces an output 1720. The 4-to-1 multiplexer 1705 receives four sets of configuration data, F(0) to F(3), at its inputs. Based on the value of the select signal S, the multiplexer connects one of its inputs to its output. The signal S is dependent on the value of a user signal, Z. As shown, the output of the multiplexer 1705 is connected to the input of the look-up table (LUT) 1710. LUT 1710 is a reconfigurable circuit. In each sub-cycle, the configuration data set 1715 that the LUT receives determines the operation that the LUT performs during that sub-cycle.

As shown, when the user signal Z is 0, the select signal S of the multiplexer selects configuration data sets F(0) and F(1). When the user signal is 1, the multiplexer selects configuration data sets F(0) and F(3). The LUT is designed to perform an XOR operation if it receives configuration data set F(1) and to perform an addition operation if it receives configuration data set F(3). The LUT, therefore, conditionally performs either an XOR or an addition operation based on the value of the user signal Z received at the select line S.

Circuit 1700 performs a similar operation as the circuit 1600. While the circuit 1600 requires two logic circuits 1605 and 1610 and a multiplexer 1615, circuit 1700 only needs a LUT and its associated configuration multiplexer 1705. Circuit 1700, therefore, saves on the logic circuitry and routing resources in a situation where two different operations have to be performed.

V. Use of TMUX and Function Decomposition in Automatic Circuit Design

TMUXs can be used to implement functions with large fan-ins using circuit components with fewer inputs. More specifically, some embodiments use a function decomposition (e.g., Shannon decomposition) to decompose functions. A Shannon decomposition decomposes a function F(a, b, . . . , n) into two functions $F_0$ and $F_1$, each with one less input. The following equation (B) shows an example of performing Shannon decomposition on a multiple input function, F.

$$F(a,b,\ldots,n)=[\{a \cdot F_1(b,\ldots,n)\}+\{\overline{a} \cdot F_0(b,\ldots,n)\}] \quad (B)$$

Some embodiments use TMUXs to implement the "if-then-else" (ITE) expression needed for Shannon decomposition. For instance, if the user design requires only four space-time contexts and the space-time context generator supports generating eight configuration data sets, the extra space-time context can be used to perform a function that is decomposed using Shannon decomposition.

For instance, the reconfigurable circuits can be programmed to use one set of the space-time context (e.g., space-time context 0) if the user input (e.g., variable a in Equation A, above) is 1 and to use the other set of space-time context (e.g., space-time context 2) if the user input is 0. The reconfigurable circuits are then designed in a way that when they receive the space-time context 0, they perform the first part of the Shannon decomposed function (e.g., $F_1(b, \ldots, n)$ in Equation A, above) and when they receive the space-time context 2, they perform the other part of the Shannon decomposed function (e.g., $F_0(b, \ldots, n)$ in Equation A, above).

Figure 18:
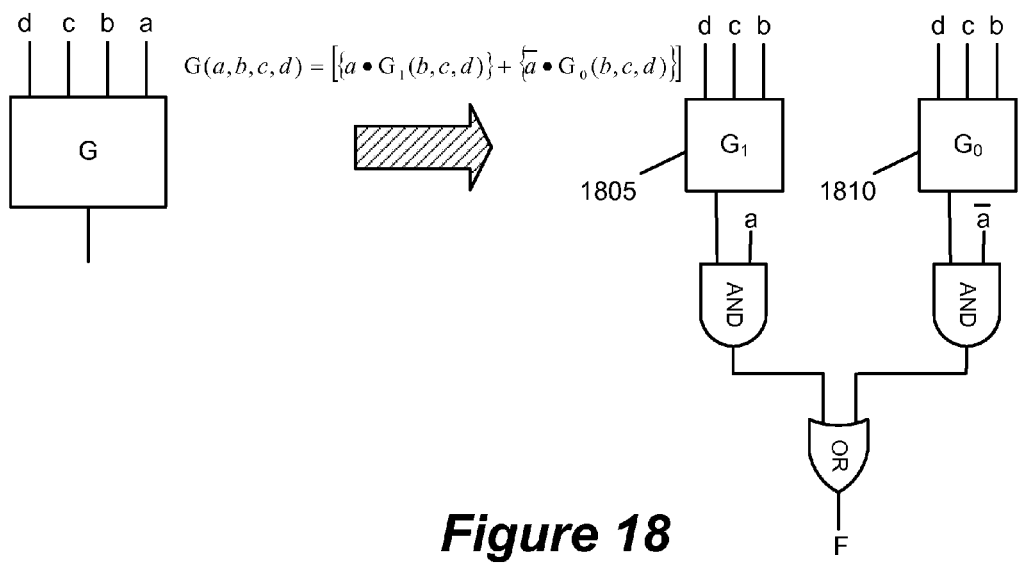
FIG. 18 illustrates Shannon decomposition used to break a function into two functions with fewer inputs.

As an example, FIG. 18 illustrates a function, G that requires four inputs a, b, c, and d. Shannon decomposition is used to break this function into two functions with three inputs each. Specifically, the four input function G(a, b, . . . , n) is decomposed into two functions $G_0$ and $G_1$:

$$G(a,b,c,d)=[\{a \cdot G_1(b,c,d)\}+\{\overline{a} \cdot G_0(b,c,d)\}]$$

Figure 19:
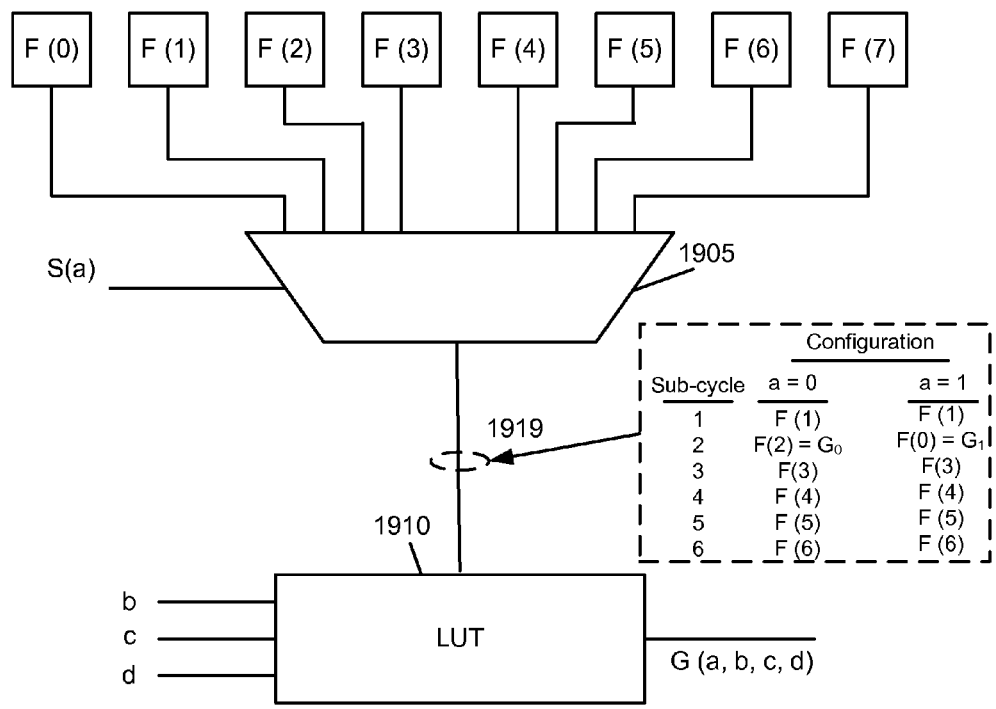
FIG. 19 illustrates the use of time multiplexer in some embodiments to implement a 4-input function by utilizing a 3-input LUT.

As shown in FIG. 18, function G is implemented with two 3-input logic circuits 1805 and 1810 as well as two AND gates and one OR gate. FIG. 19 illustrates the use of a TMUX in implementing the same function G. Multiplexer 1905 is designed to provide configuration data sets 1915 to logic circuit (in this example, a LUT) 1910. Depending on the value of its select signal, S, multiplexer 1905 connects one of two groups of configuration data sets to LUT 1910. As shown, the select signal is a function of input "a" of function G. If a is 0, the group F(1), F(2), F(3), F(4), F(5), and F(6) is used in a loop to configure the LUT. Otherwise, if a is 1, the group F(1), F(0), F(3), F(4), F(5), and F(6) is used in a loop to configure the LUT. By configuring LUT 1910 to perform function $G_0$ when the LUT receives configuration data set F(2) and to perform function $G_1$ when the LUT receives configuration data set F(0), the 3-input LUT 1910 can perform 4-input function G.

Shannon Decomposition Based on the Early Arriving Signals

Figure 20:
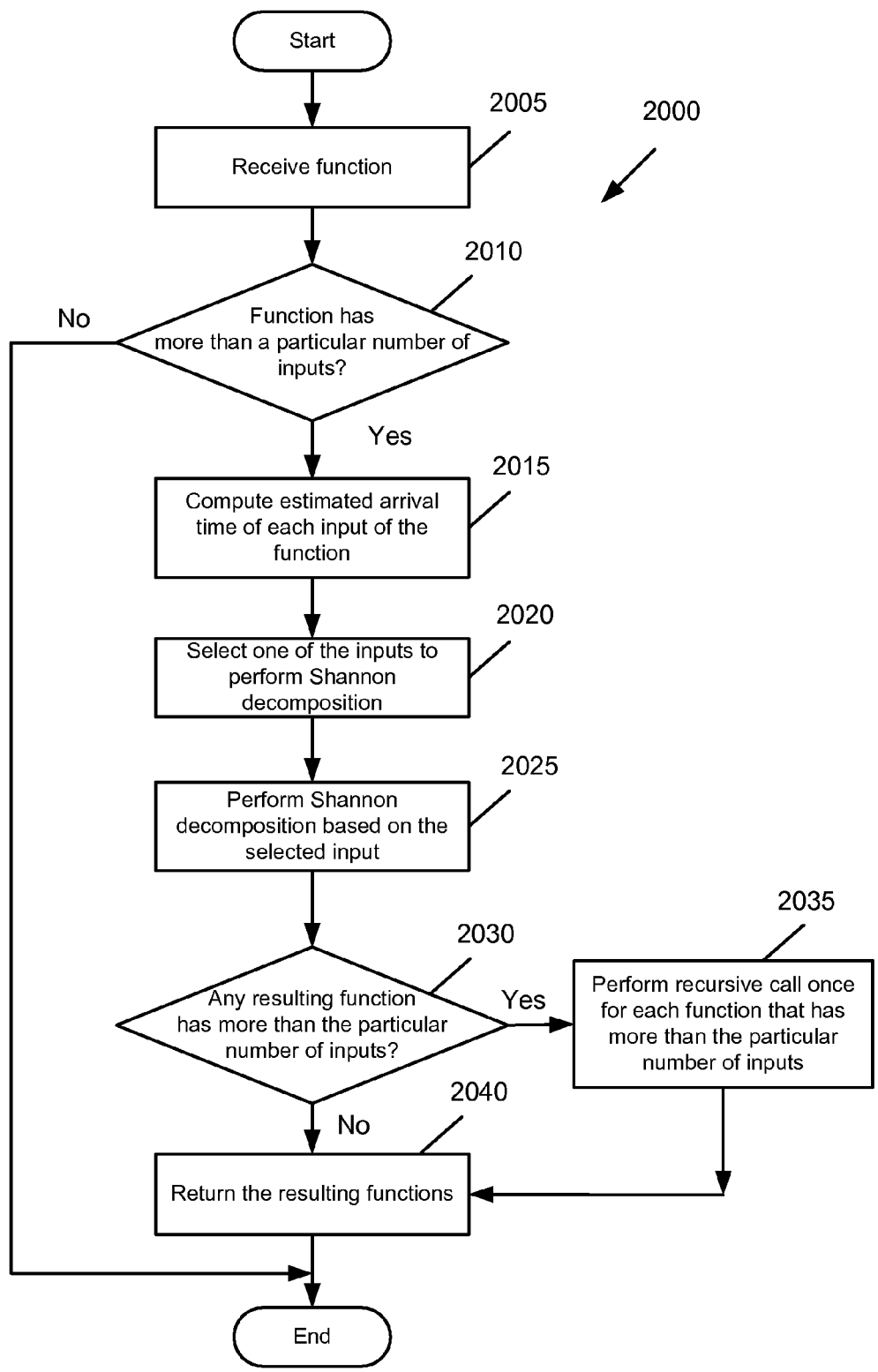
FIG. 20 illustrates a process of some embodiments that uses Shannon decomposition to decompose a function that has more than a particular number of inputs.

FIG. 20 illustrates a process 2000 of some embodiments that uses Shannon decomposition to decompose a function that has more than a particular number of inputs. For instance, in some embodiment if a certain portion of an IC has circuits to perform 3-input functions, the particular number of inputs is set to four. The resulting functions are decomposed using Shannon decomposition one more time as described further below in connection with FIG. 23 before being implemented. As shown in FIG. 20, the process receives (at 2005) the function to decompose. The process determines (at 2010) whether the function has more than a particular number of inputs. If no, the process exits. Otherwise, the process proceeds to 2015 to compute the estimated arrival time of each input of the function.

The process selects (at 2020) one of the inputs as the pivot to perform Shannon decomposition. This input will be used, as input "a" is used in equation (B) above, to decompose the received function. In some embodiments, one of the earliest arriving input is selected to perform the decomposition. An early arriving signal is used to ensure that the input signal that is used in selecting configuration bits arrives early and is stable at the beginning of the sub-cycle. The use of an early arriving signal for doing Shannon decomposition in this invention is in contrast to the use of late arriving signals that is common with doing Shannon decomposition in circuit design. Prior use of Shannon decomposition in circuit design used the late arriving signals in doing the decomposition in order to allow operations be done on the early arriving signals selected with the late arriving signal.

Figure 21:
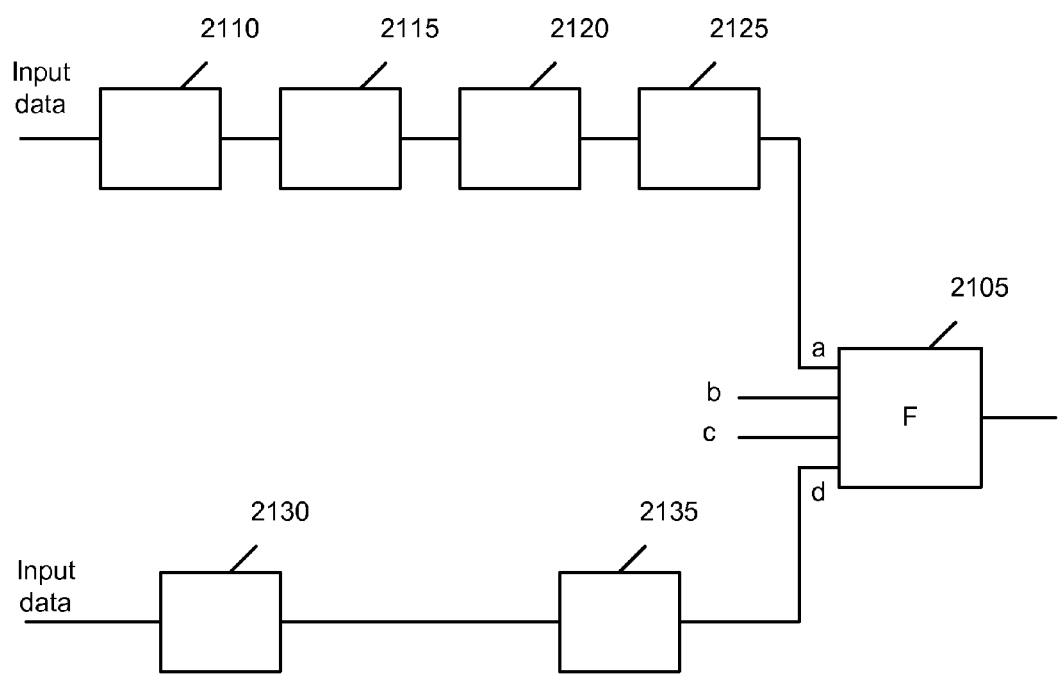
FIG. 21 conceptually illustrates two input signals of a logic circuit that go through several other logic circuits prior to arrival.

In some embodiments, the early arriving input signals are estimated by the number of logic circuits the signal has to travel through to arrive at the input. For instance, as shown in FIG. 21 the signal for input "a" of the logic circuit 2105 has to go through four logic circuits 2110-2125 while the input signal for the input "d" has to go through only two logic circuits 2130-2135. The signal for "d" input which goes through less number of circuits is, therefore, estimated to arrive earlier than the signal for input "a".

Figure 22:
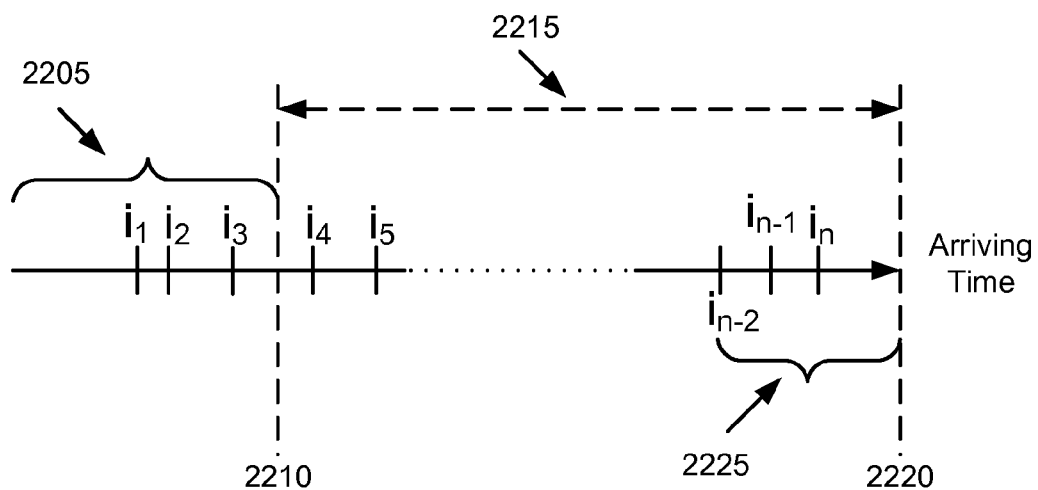
FIG. 22 conceptually illustrates the arrival time of a set of inputs that are received by a circuit.

In some embodiments, a heuristic is used to select one of the earliest arriving inputs to perform Shannon decomposition. The selected input (not necessarily the particular earliest arriving input) is chosen from a group of inputs that, when used as the pivot in Shannon decomposition, will not cause any delays in generating the final result of the received function. FIG. 22 conceptually illustrates a set of inputs $i_1$ to $i_n$ that are received by a circuit. Some embodiments identify a group of early arriving signals 2205. For instance, in some embodiments these inputs have to arrive before a threshold time 2210.

In some embodiments, this threshold time is a certain amount time (shown by time period 2215) prior to an event 2220. In some embodiments, this event 2220 is the time that the circuit produces an output for the current user clock cycle. In other embodiments, this event is the start of the next user clock cycle. In some embodiments, the time period 2215 is selected such that it allows for an arrived signal in input group 2205 to become stable for being used during the next user clock cycle.

Different embodiments use different techniques to identify which input in the early arriving input group 2205 to be used as pivot for Shannon decomposition. Some embodiments perform trial and error to select one of the inputs. Some embodiments associate a cost (e.g., number of logic circuits, amount of required routing resources, delays produced in generating the output, etc.) for the decomposition and select an input that minimized the given cost. Several heuristics for approximating disjoint decompositions are described in "Logic Minimization Algorithms for VLSI Synthesis" by Robert K. Brayton, et al. which is herein incorporated by reference.

Referring to FIG. 20, after selecting one of the inputs to perform Shannon decomposition, the process performs (at 2025) Shannon decomposition on the received function based on the identified input. The process then determines (at 2030) whether any resulting functions of Shannon decomposition has more than the particular number of inputs. When the process determines (at 2030) that none of the resulting functions have more than the particular number of inputs, the process proceeds to 2040 which is described below. Otherwise, the process recursively calls itself (at 2035) once for each of these functions. After the process receives the results of its recursive calls, the process returns (at 2040) the functions that the process identified itself or identified through its recursive calls, and then ends.

Figure 23:
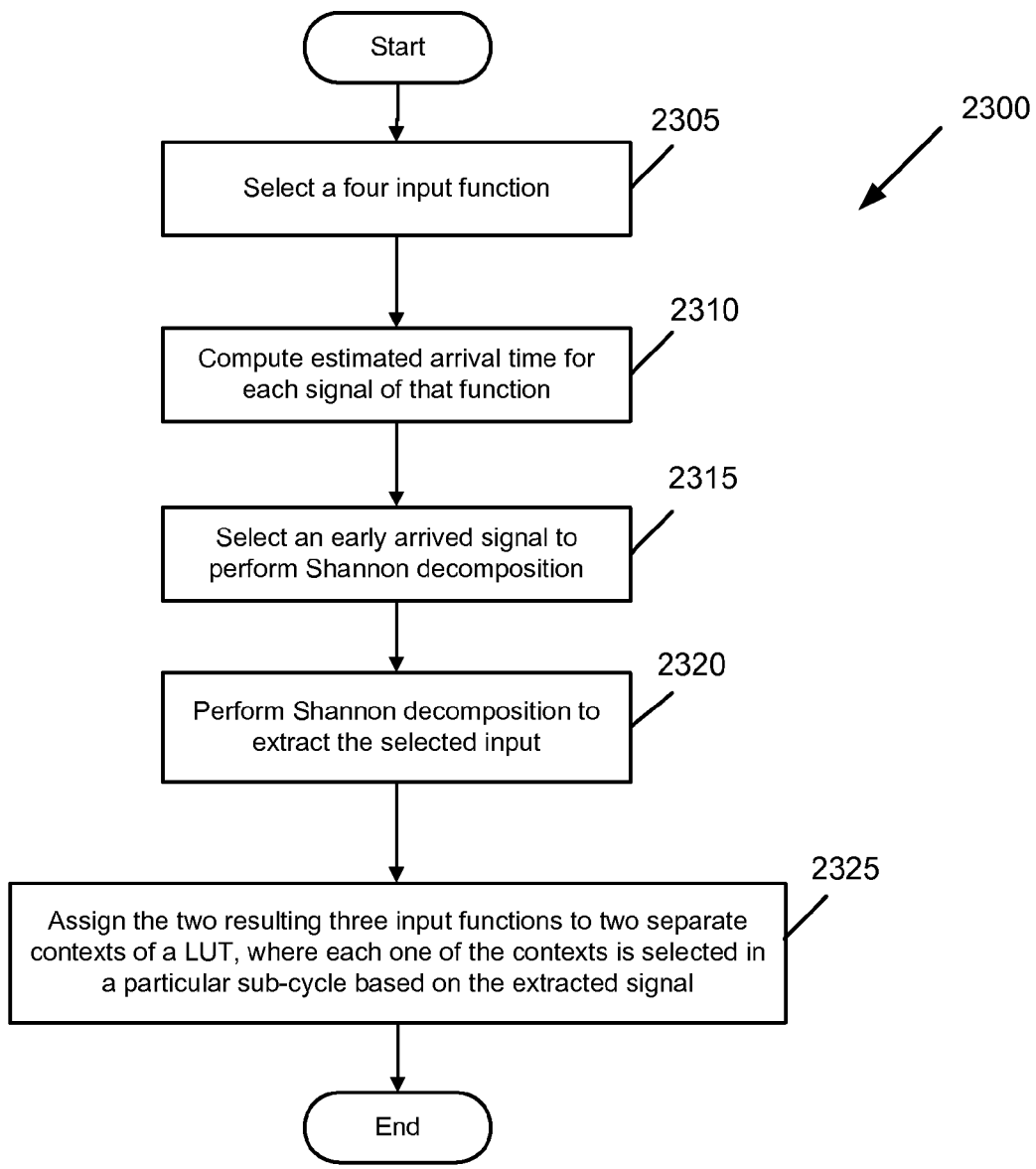
FIG. 23 illustrates a process of some embodiments that uses Shannon decomposition to decompose a 4-input function and implement the resulting two functions using time multiplexer.

When the original function has been broken down into a series of functions with the particular number of inputs, the original function is implemented using the available circuitry on the IC. As an example, FIG. 23 illustrates a process 2300 that facilitates implementing a 4-input function using a 3-input reconfiguration circuit. Although this example is shown for a 4-input function, a person of ordinary skill in the art realizes that the same technique can be used to implement any n-input function with a reconfigurable circuit with n−1 inputs.

As shown. The process receives (at 2305) the function to be implemented. The process then computes (at 2310) the estimated arrival time of each of the input signals of the function. After 2310, the process selects (at 2315) an input as pivot for Shannon decomposition as described in relation with process 2000 above. Next, the process performs (at 2320) Shannon decomposition on the function to extract this input. The process then assigns (at 2325) the two resulting 3-input functions to two separate contexts of a function generator (such as a LUT), where each one of the contexts is selected in a particular sub-cycle based on the extracted signal. The IC synthesizer has to designate an association between the two functions in order for the placer to assign both functions to the same LUT to ensure the correct operation of the resulting TMUX.

VI. Space-Time Context Generator

A. ST-Context Generator

To facilitate the loopered scheme described in the previous sections, some embodiments use a multi-tiered multiplexer structure that uses three clocks signals CLK, STo, and STe to select different configuration data sets for a configurable circuit. The configuration data sets then determine the function that the configurable circuit performs. In some embodiments, the configuration data sets for configurable circuits are stored in memory locations (e.g., in SRAM cells), referred to as configuration storage. Examples of tiered multiplexer structures are described in detail in the above mentioned U.S. patent application Ser. No. 11/081,859.

In some embodiments, each one of the clock signals CLK, STo, and STe are generated as a differential pair of signals. Some of these embodiments globally distribute the differential pair of CLK and $\overline{CLK}$ signals, while locally generating the signals STo <0:3> and STe <0:3>. Some embodiments use a global clock generator to generate the differential clock signals CLK and $\overline{CLK}$. In some embodiments, the global clock generator is outside of the configurable tile arrangement (e.g., the generator might be on a different circuit than the IC that includes the configurable tile arrangement, or it might be partially or completely on the IC that includes the arrangement but positioned outside of the arrangement). However, in other embodiments, this global clock generator can be placed within the configurable tile arrangement.

Figure 24:
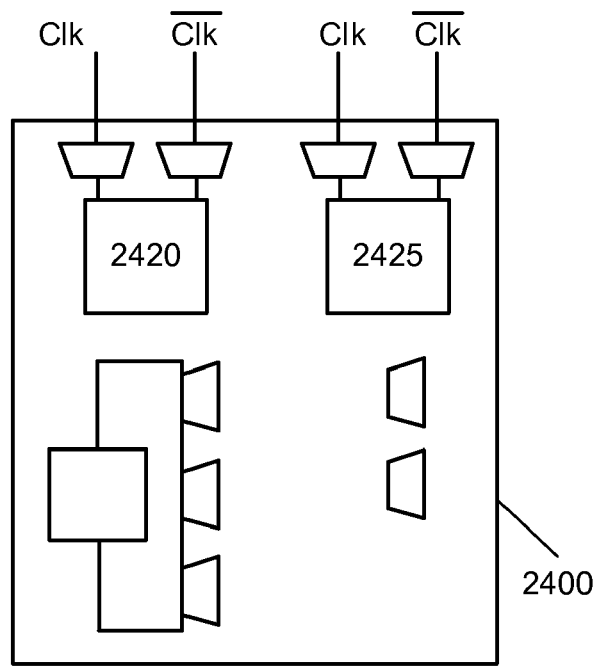
FIG. 24 conceptually illustrates a tile of some embodiments.

In some embodiments, the globally distributed differential clock signals CLK and $\overline{CLK}$ are received by two local ST-context generators in each tile. FIG. 24 conceptually illustrates a tile 2400 of some embodiments. The local ST-context generator 2425 in the tile provides the signals STo and STe for the tiered multiplexer structures that retrieve and provide configuration data sets to the routing multiplexers of the tile. The local ST-context generator 2420 in the tile provides the signals STo and STe for the tiered multiplexer structures that retrieve and provide configuration data sets to the input select multiplexers and three-input LUT of the tile. Having two different local ST-context generators 2420 and 2425 for each tile allows the embodiments illustrated in FIG. 24 to have the routing multiplexers of a tile operate on different clock domains than the input select multiplexers and the LUT of the tile. This is beneficial for allowing the routing multiplexers of a tile to be used to route signals that belong to different clock domains than the logic circuits of the tile.

Figure 25:
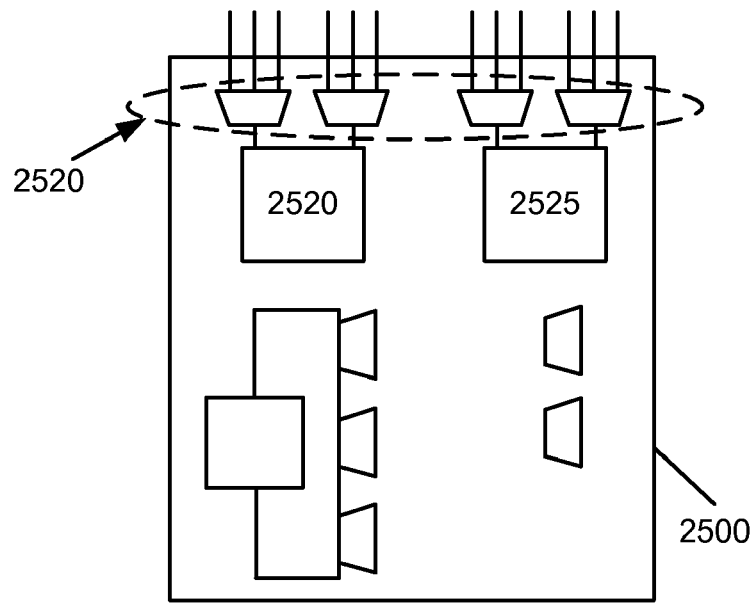
FIG. 25 conceptually illustrates a tile of some embodiments.

Having different local ST-context generators for different tiles allows the embodiments illustrated in FIG. 24 to have different tiles operate on different clock domains (i.e., on different global clock signals that are based on different clock domains). Specifically, some embodiments include one global clock generator for each clock domain that the reconfigurable IC can handle. For instance, an IC design might require the IC to interface with two bus interfaces that operate at two different rates and to implement a particular design that operates at yet another rate. In such a situation, the reconfigurable IC might include three global clock generators, two for generating the clock signals associate with the two bus interfaces and one for receiving the design clock signal, as illustrated in FIG. 25.

In some embodiments, the three global clock generators are on the configurable IC and generate their three clocks based on three clocks signals that they received from outside of the IC. As shown, the local ST-context generators (2520 and 2525) within the configurable tile 2500 are preceded by a set of multiplexers 2520 that route one of the globally distributed clocks and its complement to each local ST-context generator. The local ST-context generators in the tile then generate their local clocks STo and STe based on the received global clocks. For instance, in the example mentioned above, the local ST-context generators of the set of tiles that implement one bus interface receive the global clock signal for that bus interface and generate the local sub-cycle signals that are needed to achieve the operational rate for implementing the particular bus interface.

Figure 26:
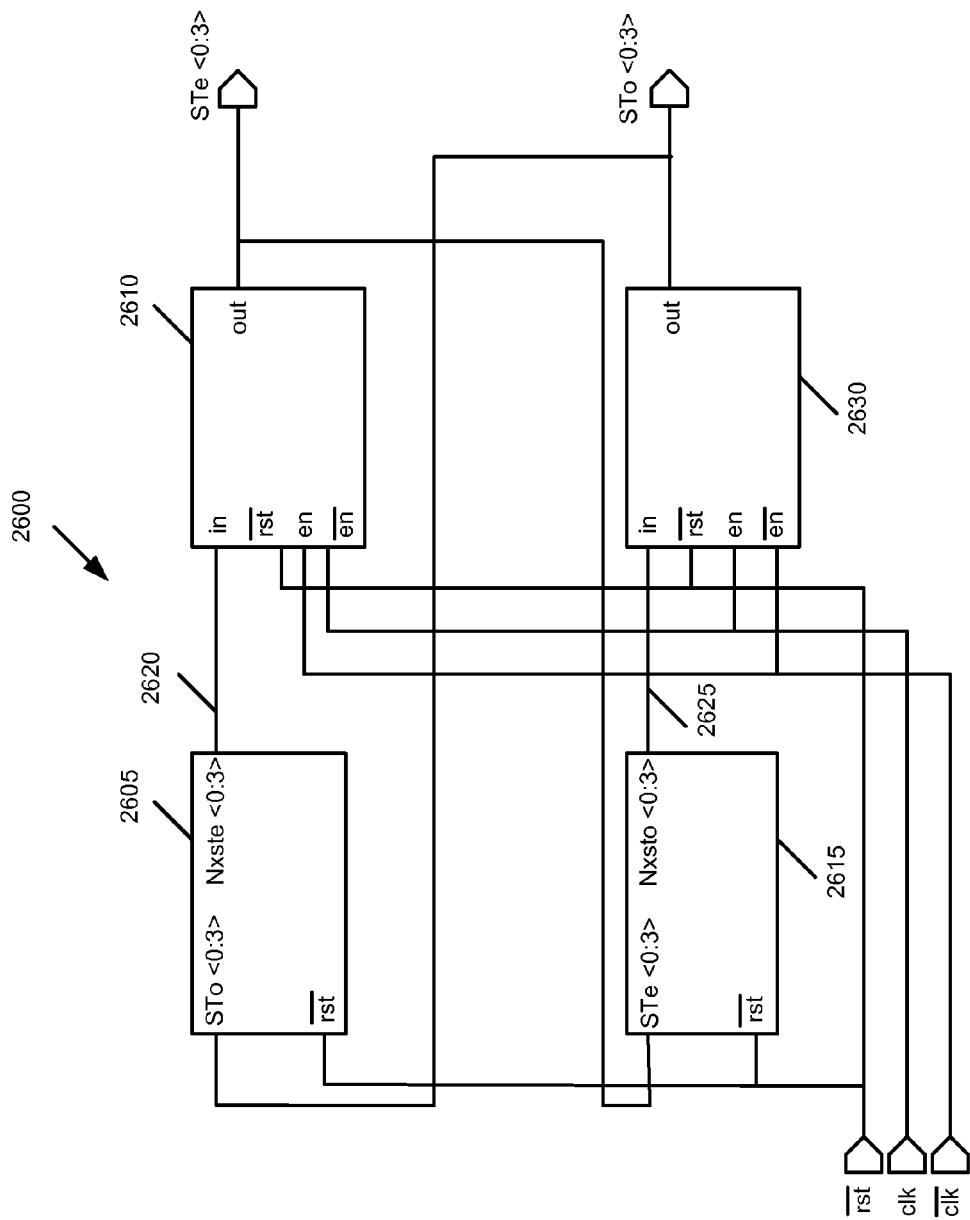
FIG. 26 illustrates a space-time context generator of some embodiments.
Figure 27:
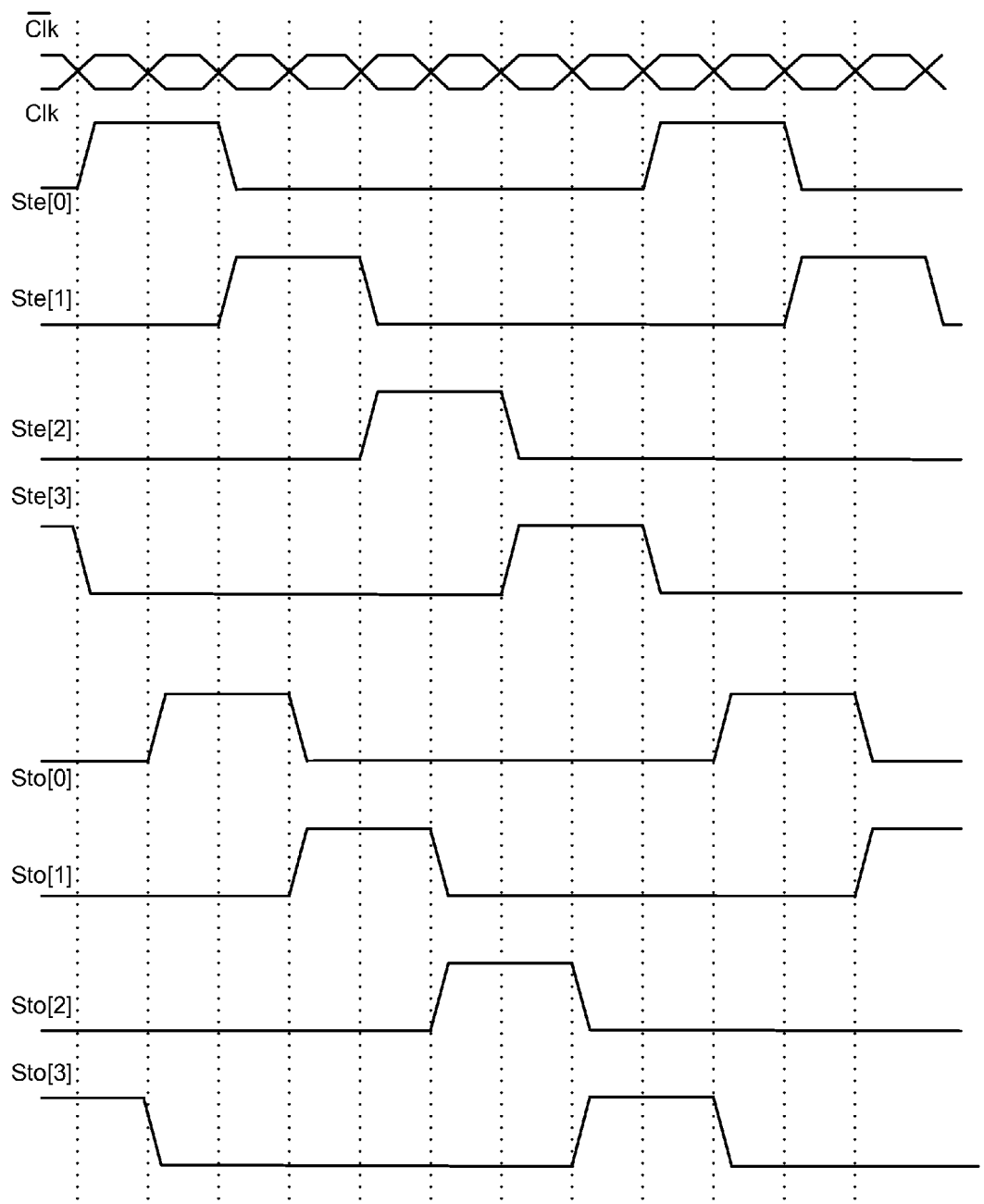
FIG. 27 illustrates the timing between the Clk signal and the two sets of four one-hot signals.

FIG. 26 illustrates an ST-context generator 2600 of some embodiments. The ST-context generator 2600 is a signal generator that can generate sub-cycle signals to drive (using e.g., tiered multiplexers and configuration storage) a reconfigurable circuit to go through the states in a loop similar to the loops shown in FIG. 2. This ST-context generator generates two sets of sub-cycle signals STe (state-time even) and STo (state-time odd) that are offset by 90°. As shown, the sub-cycle signal STe is generated by a next-state decoder 2605 and is latched by a set (or a row) of latch drivers 2610. Similarly, the sub-cycle signal STo is generated by a next-state decoder 2615 and is latched by the row latch drivers 2630. In the example shown in FIG. 26, each set of sub-cycle signals, STe and STo has four individual one-hot signals. FIG. 27 illustrates an example of two sets of one-hot signals STo and STe. As shown, at each point of time, only one of the signals in each one-hot set is logical 1.

Each next-state decoder (2605 and 2615) act as a counter that determines the next context generated. Specifically, the next state decoder 2605 gets a one-hot state and generates a one-hot next state. The output 2620 of this decoder is sent of a set of row latches 2610. These latches are drivers with built-in latches. Similarly, the next state decoder 2615 gets a one-hot state and generates a one-hot next state. The output 2625 of this decoder is sent of a set of row latches 2630. The next-state decoders can be programmed to count up to a certain number depending on how many configuration states are required. For instance, the next-state decoders can be programmed to generate 4, 6, or 8 configuration states.

In some embodiments, each set of latches 2610 or 2630 includes four latches connected in a row. The output of each of the first three latches is connected to the input of the next latch. The output of the last latch is fed back to the input of the opposite next-state generator. As the latches are clocked, the output value of each latch is copied to the input of the next latch. In order to generate eight sub-cycle signals, each of the STe and STo signals has to have four bits and each of the next-state decoders 2605 and 2615 generate a four bit output 2620 and 2625 respectively. The output of the next-state decoder 2605 is latched using the set of latches 2610. Similarly, the output of the next-state decoder 2615 is latched using the set of latches 2630. For eight sub-cycle signals, the output of each next-state decoder will have four bits and each set of latches will have four latches. As shown, the output of each row latch 2610 and 2630 are fed back to the input of the other next state decoder (2615 and 2605, respectively) in order to ensure that the two signals STe and STo are offset by 90°.

As shown in FIG. 26, the clock signal (Clk) is connected to enable input (en) of row latches 2630 while $\overline{Clk}$ is connected to $\overline{en}$ input. In contrast, $\overline{Clk}$ is connected to en input of row latches 2610 and Clk signal is connected to $\overline{en}$ input. The row latches 2610 and 2630, therefore, operate on different edges of the clock signal. This arrangement eliminates the need for one set of flip flops to operate on the rising edge of the clock and another set of flip flops to operate on the falling edge of the clock.

Figure 28:
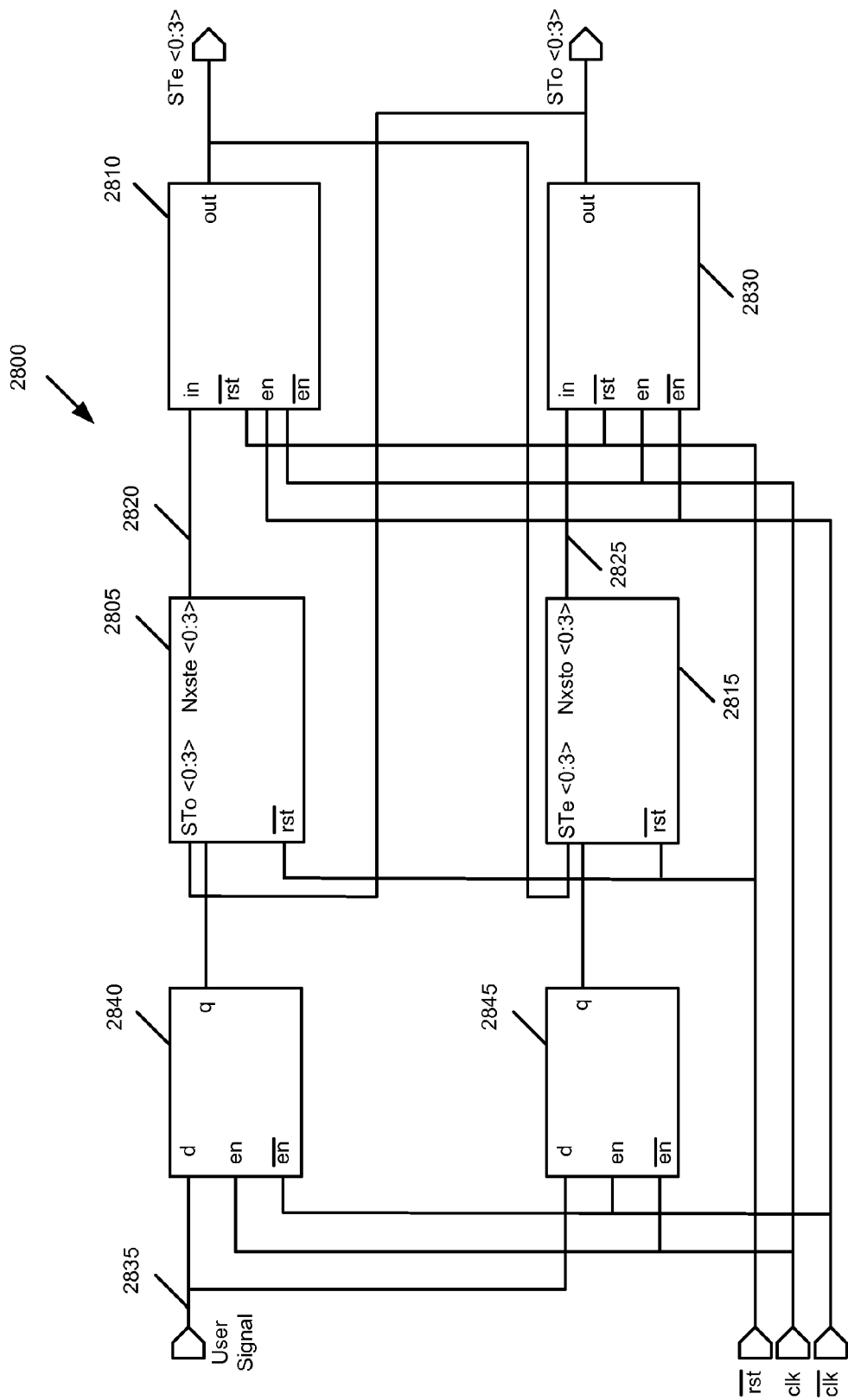
FIG. 28 illustrates a space-time context generator of some embodiments that uses a user-design signal to generate the next space-time context.

B. ST-Context Generator that Generates Sub-Cycle Signals Based on User-Design Signals FIG. 28 illustrates an ST-context generator 2800 of some embodiments that can generate configuration data sets based on a user-design signal. This ST-context generator can generate configuration data sets shown in FIGS. 2-5. This context generator is similar to the context generator shown in FIG. 26 with the addition of being able to utilize a user signal 2835 to determine the signal generated by the next-state decoders 2805 and 2815.

In order to incorporate the user signal, two user latches (2840 and 2845) are added to the ST-context generator. As shown, the user signal 2835 is latched into user latches 2840 and 2845 and is fed into the next-state decoders 2805 and 2815. Latching the user signal ensures that user signal is stable while the next state is calculated by the next-state decoders 2805 and 2815. The next-state decoders 2805 and 2815 utilize the user signal 2835 to generate the context for the next sub-cycle.

Figure 29:
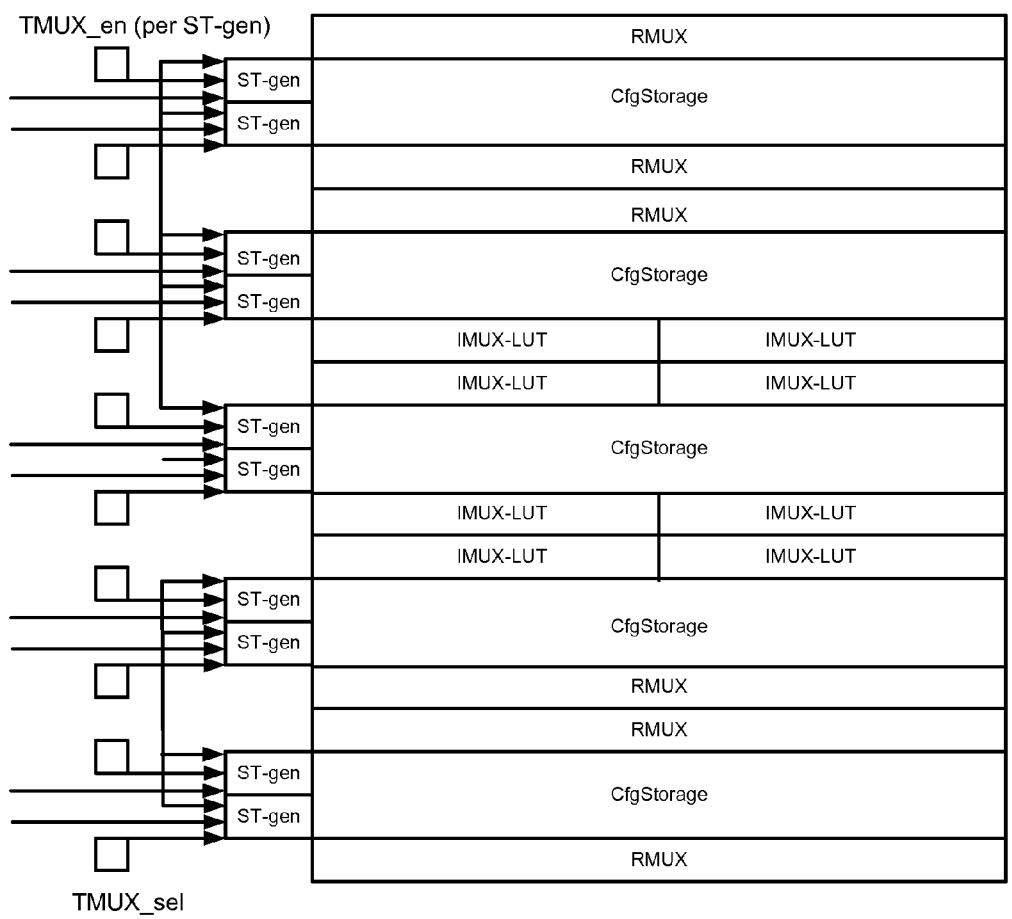
FIG. 29 illustrates the detailed tile arrangement of some embodiments.

In some embodiments, two 4-aligned LUTs are tied together to form a single tile, in order to save configuration storage and configuration network overhead. FIG. 29 illustrates the organization of one such tile in some embodiments. As shown, two sets of 4-aligned LUTs and their associated IMUXs and RMUXs share five configuration memories. The LUTs in each set of 4-aligned LUTs share one carry chain. The addressing is done per half row. When the context is changed for one of the RMUXs in each half row, the context for all RMUXs in that half row is changed.

VII. Configurable IC and System

Some embodiments described above are implemented in configurable ICs that can compute configurable combinational digital logic functions on signals that are presented on the inputs of the configurable ICs. In some embodiments, such computations are state-less computations (i.e., do not depend on a previous state of a value). Some embodiments described above are implemented in configurable ICs that can perform a continuous function. In these embodiments, the configurable IC can receive a continuous function at its input, and in response, provide a continuous output at one of its outputs.

Figure 30:
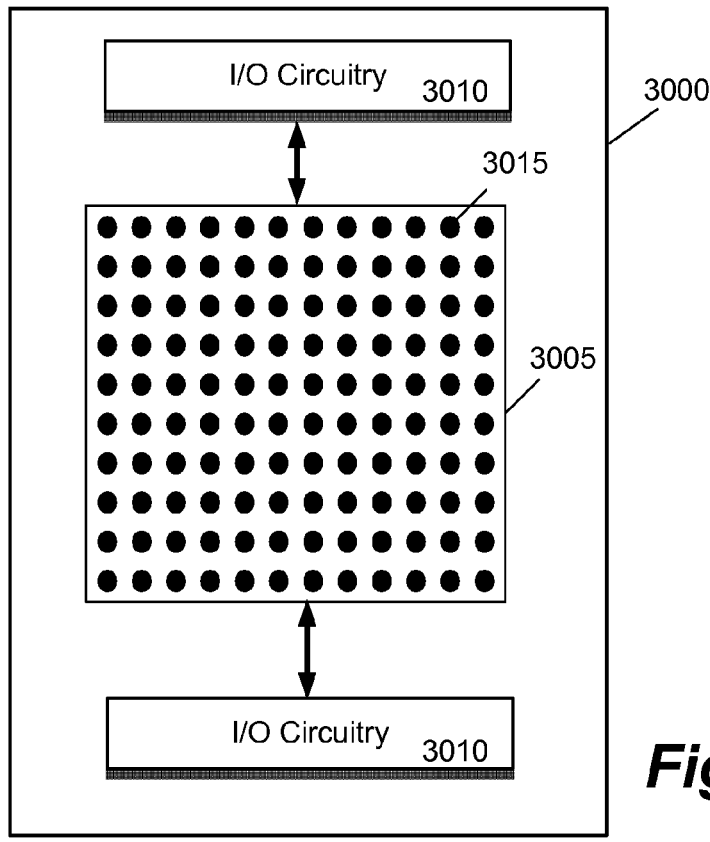
FIG. 30 illustrates a portion of a configurable IC of some embodiments of the invention.

FIG. 30 illustrates a portion of a configurable IC 3000 of some embodiments of the invention. As shown in this figure, this IC has a configurable circuit arrangement 3005 and I/O circuitry 3010. The configurable circuit arrangement 3005 can be any of the invention's configurable circuit arrangements that were described above. The I/O circuitry 3010 is responsible for routing data between the configurable nodes 3015 of the configurable circuit arrangement 3005 and circuits outside of this arrangement (i.e., circuits outside of the IC, or within the IC but outside of the configurable circuit arrangement 3005). As further described below, such data includes data that needs to be processed or passed along by the configurable nodes.

Figure 31:
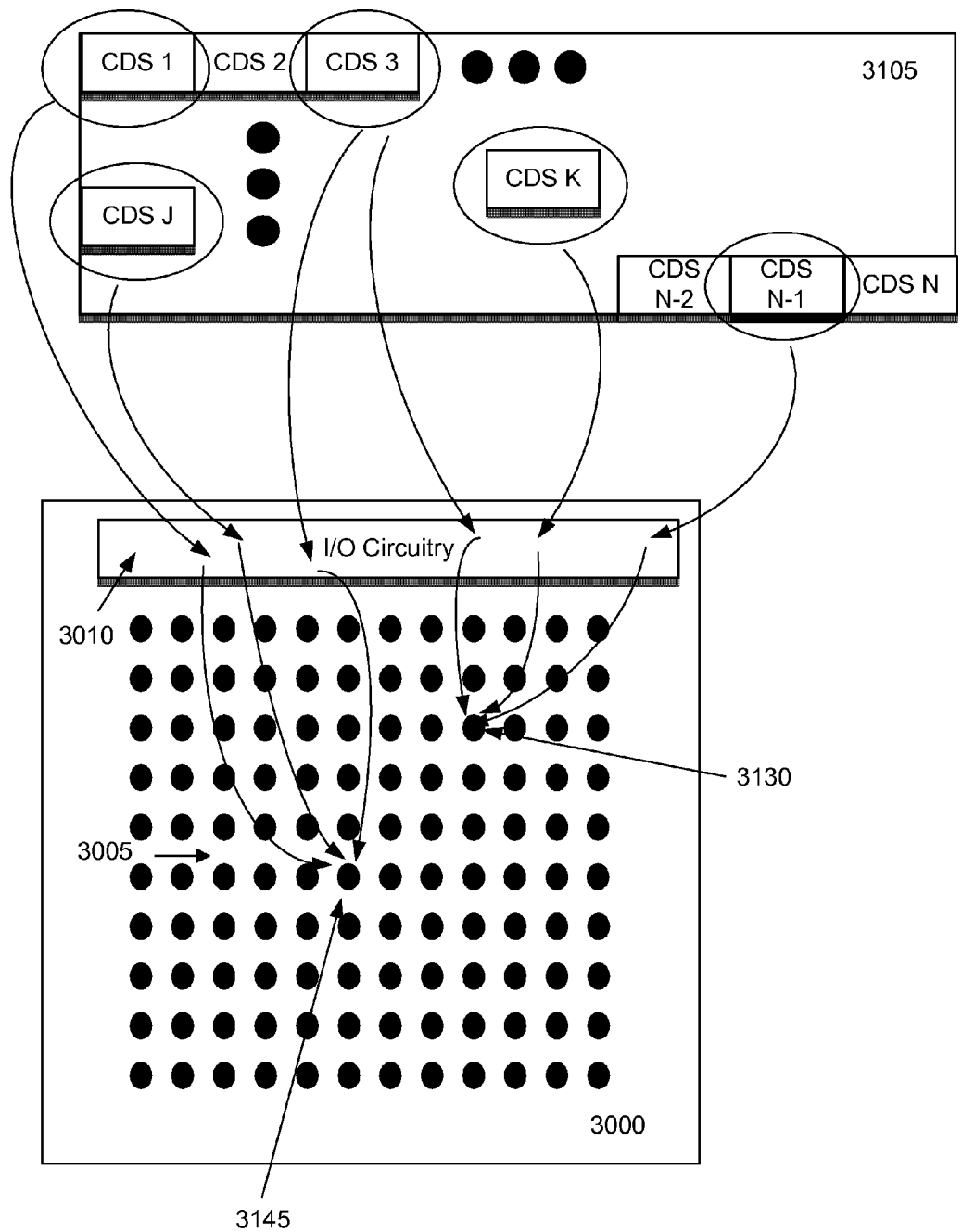
FIG. 31 illustrates a more detailed example of data between a configurable node and a configurable circuit arrangement that includes configuration data that configure the nodes to perform particular operations.

The data also includes in some embodiments configuration data that configure the nodes to perform particular operations. FIG. 31 illustrates a more detailed example of this. Specifically, this figure illustrates a configuration data pool 3105 for the configurable IC 3000. This pool includes N configuration data sets (CDS). As shown in FIG. 31, the input/output circuitry 3010 of the configurable IC 3000 routes different configuration data sets to different configurable nodes of the IC 3000. For instance, FIG. 31 illustrates configurable node 3145 receiving configuration data sets 1, 3, and J through the I/O circuitry, while configurable node 3150 receives configuration data sets 3, K, and N−1 through the I/O circuitry. In some embodiments, the configuration data sets are stored within each configurable node. Also, in some embodiments, a configurable node can store multiple configuration data sets so that it can reconfigure quickly by changing to another configuration data set. In some embodiments, some configurable nodes store only one configuration data set, while other configurable nodes store multiple such data sets.

Figure 32:
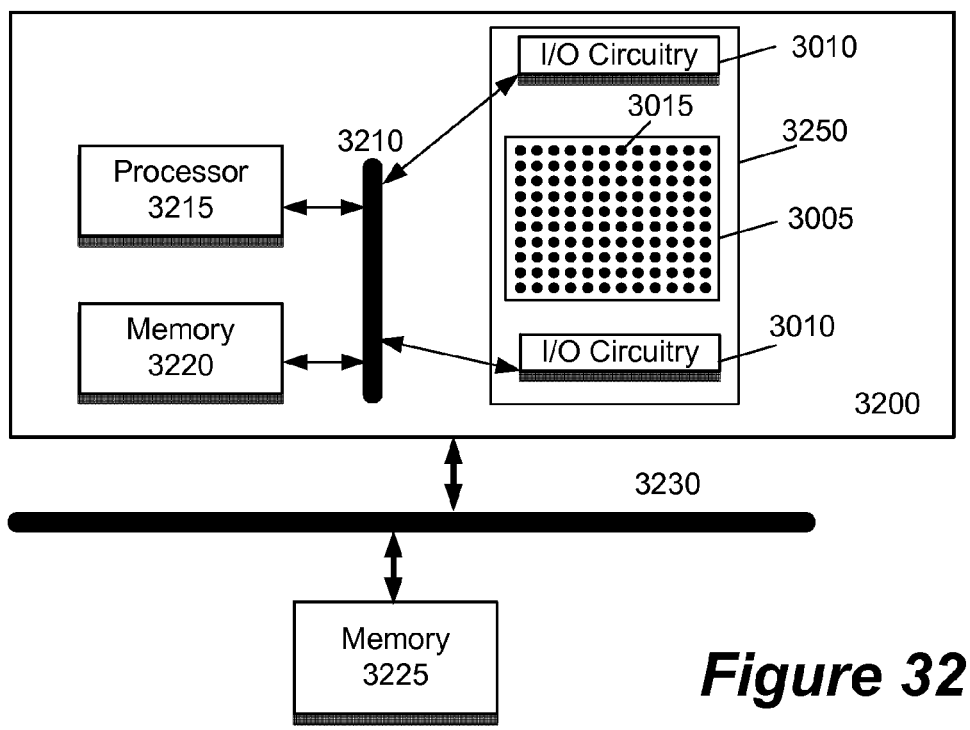
FIG. 32 illustrates a system on chip ("SoC") implementation of a configurable IC.

A configurable IC of the invention can also include circuits other than a configurable circuit arrangement and I/O circuitry. For instance, FIG. 32 illustrates a system on chip ("SoC") implementation of a configurable IC 3200. This IC has a configurable block 3250, which includes a configurable circuit arrangement 3105 and I/O circuitry 3110 for this arrangement. It also includes a processor 3215 outside of the configurable circuit arrangement, a memory 3220, and a bus 3210, which conceptually represents all conductive paths between the processor 3215, memory 3220, and the configurable block 3250. As shown in FIG. 32, the IC 3200 couples to a bus 3230, which communicatively couples the IC to other circuits, such as an off-chip memory 3225. Bus 3230 conceptually represents all conductive paths between the components of the IC 3200.

This processor 3215 can read and write instructions and/or data from an on-chip memory 3220 or an off-chip memory 3225. The processor 3215 can also communicate with the configurable block 3250 through memory 3220 and/or 3225 through buses 3210 and/or 3230. Similarly, the configurable block can retrieve data from and supply data to memories 3220 and 3225 through buses 3210 and 3230.

Figure 33:
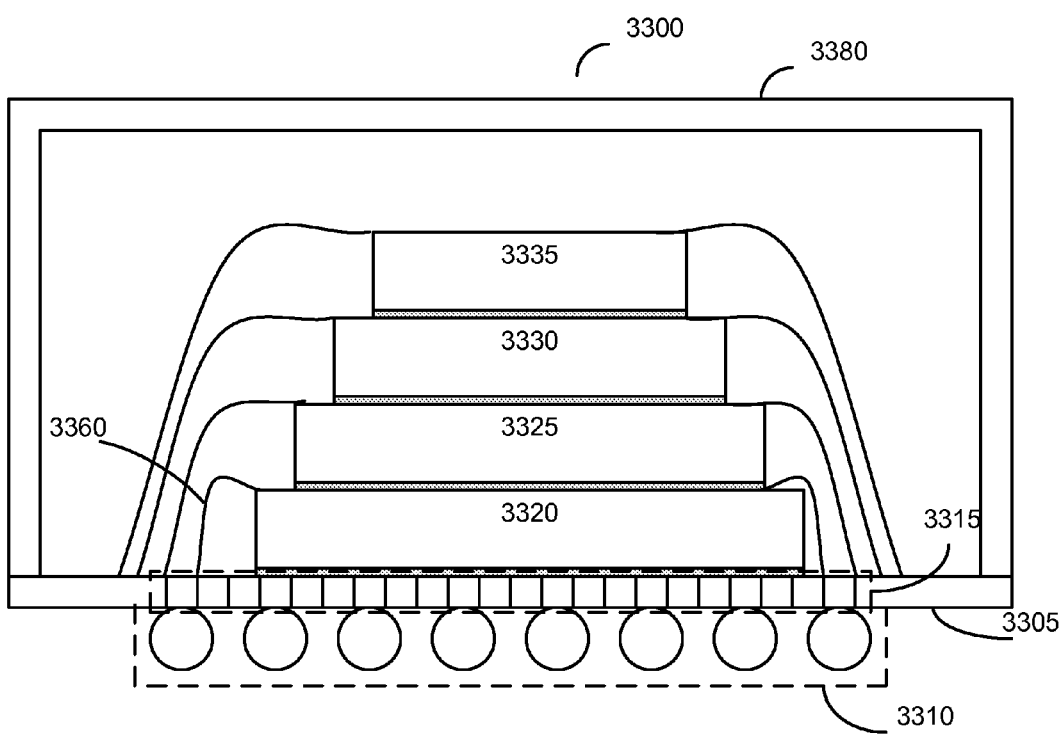
FIG. 33 illustrates an embodiment that employs a system in package ("SiP") implementation for a configurable IC.

Instead of, or in conjunction with, the system on chip ("SoC") implementation for a configurable IC, some embodiments might employ a system in package ("SiP") implementation for a configurable IC. FIG. 33 illustrates one such SiP 3300. As shown in this figure, SiP 3300 includes four ICs 3320, 3325, 3330, and 3335 that are stacked on top of each other on a substrate 3305. At least one of these ICs is a configurable IC that includes a configurable block, such as the configurable block 3250 of FIG. 32. Other ICs might be other circuits, such as processors, memory, etc.

As shown in FIG. 33, the IC communicatively connects to the substrate 3305 (e.g., through wire bondings 3360). These wire bondings allow the ICs 3320-3335 to communicate with each other without having to go outside of the SiP 3300. In some embodiments, the ICs 3320-3335 might be directly wire-bonded to each other in order to facilitate communication between these ICs. Instead of, or in conjunction with the wire bondings, some embodiments might use other mechanisms to communicatively couple the ICs 3320-3335 to each other.

As further shown in FIG. 33, the SiP includes a ball grid array ("BGA") 3310 and a set of vias 3315. The BGA 3310 is a set of solder balls that allows the SiP 3300 to be attached to a printed circuit board ("PCB"). Each via connects a solder ball in the BGA 3310 on the bottom of the substrate 3305, to a conductor on the top of the substrate 3305.

The conductors on the top of the substrate 3305 are electrically coupled to the ICs 3320-3335 through the wire bondings. Accordingly, the ICs 3320-3335 can send and receive signals to and from circuits outside of the SiP 3300 through the wire bondings, the conductors on the top of the substrate 3305, the set of vias 3315, and the BGA 3310. Instead of a BGA, other embodiments might employ other structures (e.g., a pin grid array) to connect a SiP to circuits outside of the SiP. As shown in FIG. 33, a housing 3380 encapsulates the substrate 3305, the BGA 3310, the set of vias 3315, the ICs 3320-3335, the wire bondings to form the SiP 3300. This and other SiP structures are further described in U.S. patent application Ser. No. 11/081,820 entitled "Method for Manufacturing a Programmable System In Package", filed on Mar. 15, 2005, now U.S. Pat. No. 7,530,044.

Figure 34:
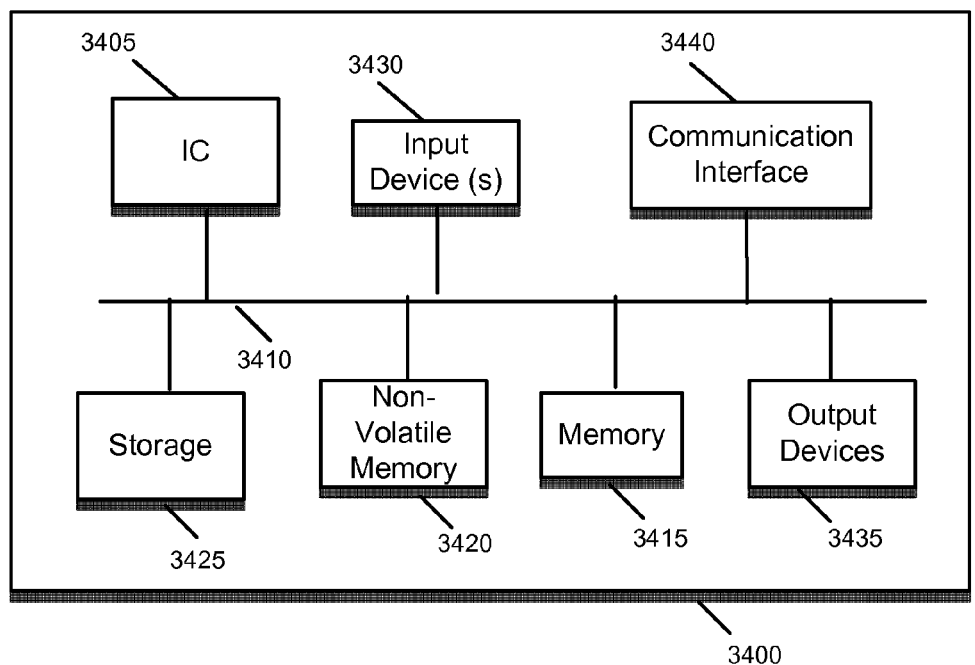
FIG. 34 conceptually illustrates a more detailed example of an electronics system that has an IC, which implements inventions of some embodiments.

FIG. 34 conceptually illustrates a more detailed example of an electronics system 3400 that has an IC 3405, which implements some of the above described inventions (such as using TMUXs to do multiplication, using TMUXs to utilize Shannon decomposition, etc). The system 3400 can be a stand-alone computing or communication device, or it can be part of another electronic device. As shown in FIG. 34, the system 3400 not only includes the IC 3405, but also includes a bus 3410, a system memory 3415, a non-volatile memory 3420, a storage device 3425, input devices 3430, output devices 3435, and communication interface 3440. In some embodiments, the non-volatile memory 3420 stores configuration data and re-loads it at power-up. Although the non-volatile memory 3420 is shown outside of the IC 3405, in some embodiments, the non-volatile memory is either on the same die or the same package as the IC 3405.

The bus 3410 collectively represents all system, peripheral, and chipset interconnects (including bus and non-bus interconnect structures) that communicatively connect the numerous internal devices of the system 3400. For instance, the bus 3410 communicatively connects the IC 3410 with the non-volatile memory 3420, the system memory 3415, and the permanent storage device 3425.

From these various memory units, the IC 3405 receives data for processing and configuration data for configuring the ICs configurable logic and/or interconnect circuits. When the IC 3405 has a processor, the IC also retrieves from the various memory units instructions to execute. The non-volatile memory 3420 stores static data and instructions that are needed by the IC 3410 and other modules of the system 3400. The storage device 3425, on the other hand, is read-and-write memory device. This device is a non-volatile memory unit that stores instruction and/or data even when the system 3400 is off. Like the storage device 3425, the system memory 3415 is a read-and-write memory device. However, unlike storage device 3425, the system memory is a volatile read-and-write memory, such as a random access memory. The system memory stores some of the instructions and/or data that the IC needs at runtime.

The bus 3410 also connects to the input and output devices 3430 and 3435. The input devices enable the user to enter information into the system 3400. The input devices 3430 can include touch-sensitive screens, keys, buttons, keyboards, cursor-controllers, microphone, etc. The output devices 3435 display the output of the system 3400.

Finally, as shown in FIG. 34, bus 3410 also couples system 3400 to other devices through a communication interface 3440. Examples of the communication interface include network adapters that connect to a network of computers, or wired or wireless transceivers for communicating with other devices. One of ordinary skill in the art would appreciate that any other system configuration may also be used in conjunction with the invention, and these system configurations might have fewer or additional components.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

What is claimed is:

1. An electronic device comprising:
    a memory device for storing configuration data; and
    an integrated circuit ("IC"), the IC comprising:
        a reconfigurable logic circuit;
        a signal generator for generating first and second selection signals based on a value of a particular number of bits of a multiplier of a multiplication operation;
        a set of configurable circuits for supplying a plurality of inputs to the reconfigurable logic circuit;
        first and second sets of configuration storage cells for storing first and second configuration data sets, wherein the first configuration data set is for configuring the reconfigurable logic circuit to perform an addition operation and the second configuration data set is for configuring the reconfigurable logic circuit to perform a subtraction operation;
        third, fourth and fifth sets of configuration storage cells for storing third, fourth and fifth configuration data sets, wherein the third, fourth and fifth configuration data sets are for configuring the set of configurable circuits to supply to the reconfigurable logic circuit either a value of a multiplicand, twice the value of the multiplicand, or a value of 0;
        a first selection circuit for supplying one of the first and second configuration data sets to the reconfigurable logic circuit based on the first selection signal, wherein, based on the configuration data set supplied to the reconfigurable logic circuit, the reconfigurable logic circuit performs either the addition operation or the subtraction operation in order to generate a partial result of the multiplication operation; and
        a second selection circuit for selecting, based on the second selection signal, one of the third, fourth and fifth configuration data sets for the set of configurable circuits.

2. The electronic device of claim 1, wherein said particular number of bits is three.

3. A method of performing a multiplication operation between a multiplier and a multiplicand, the multiplication operation comprising at least one of an addition operation and a subtraction operation performed by a particular logic circuit, the method comprising:
    examining a plurality of bits of the multiplier;
    based on the examination of the plurality of bits of the multiplier, (i) generating a first selection signal for selecting one of first and second configuration data sets stored in first and second sets of configuration storage cells, wherein the first configuration data set is for configuring the particular logic circuit to perform the addition operation and the second configuration data set is for configuring the particular logic circuit to perform the subtraction operation, (ii) generating a second selection signal for selecting one of third, fourth and fifth configuration data sets stored in third, fourth and fifth sets of configuration storage cells, wherein each of the third, fourth and fifth configuration data sets is for selecting one of a plurality of inputs to provide to the particular logic circuit;
    based on the generated first selection signal, supplying one of the first and second configuration data sets from one of the corresponding first and second sets of configuration storage cells to the particular logic circuit;
    based on the generated second selection signal, selecting one of the plurality of inputs to provide to the particular logic circuit; and
    based on the configuration data set supplied to the particular logic circuit and the selected input provided to the particular logic circuit, performing either the addition operation or the subtraction operation to generate a partial result of the multiplication operation.

4. The method of claim 3, wherein examining the plurality of bits of the multiplier comprises examining three bits of the multiplier.

5. The method of claim 3, wherein the plurality of inputs comprises a value of 0, a value of the multiplicand, and two times the value of the multiplicand.

6. An integrated circuit ("IC") for performing a multiplication operation comprising at least one of an addition operation and a subtraction operation, the IC comprising:

a reconfigurable logic circuit;

a signal generator for generating first and second selection signals based on a value of a particular number of bits of a multiplier of the multiplication operation;

a set of configurable circuits for supplying a plurality of inputs to the reconfigurable logic circuit;

first and second sets of configuration storage cells for storing first and second configuration data sets, wherein the first configuration data set is for configuring the reconfigurable logic circuit to perform the addition operation and the second configuration data set is for configuring the reconfigurable logic circuit to perform the subtraction operation;

third, fourth and fifth sets of configuration storage cells for storing third, fourth and fifth configuration data sets, wherein the third, fourth and fifth configuration data sets are for configuring the set of configurable circuits to supply as input to the reconfigurable logic circuit either a value of a multiplicand, twice the value of the multiplicand, or a value of 0;

a first selection circuit for supplying one of the first and second configuration data sets to the reconfigurable logic circuit based on the first selection signal, wherein, based on the configuration data set supplied to the reconfigurable logic circuit, the reconfigurable logic circuit performs either the addition operation or the subtraction operation in order to generate a partial result of the multiplication operation; and a second selection circuit for selecting, based on the second selection signal, one of the third, fourth and fifth configuration data sets for the set of configurable circuits.

7. The IC of claim 6, wherein said particular number of bits is three.

* * * * *